(12) United States Patent
Hsu et al.

(10) Patent No.: US 11,681,849 B2
(45) Date of Patent: Jun. 20, 2023

(54) METHOD FOR OPTIMIZING A PATTERNING DEVICE PATTERN

(71) Applicant: ASML NETHERLANDS B.V., Veldhoven (NL)

(72) Inventors: Duan-Fu Stephen Hsu, Fremont, CA (US); Xiaoyang Jason Li, Mountain View, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 200 days.

(21) Appl. No.: 16/336,485

(22) PCT Filed: Oct. 23, 2017

(86) PCT No.: PCT/EP2017/076972
§ 371 (c)(1),
(2) Date: Mar. 26, 2019

(87) PCT Pub. No.: WO2018/077787
PCT Pub. Date: May 3, 2018

(65) Prior Publication Data
US 2021/0232748 A1 Jul. 29, 2021

Related U.S. Application Data

(60) Provisional application No. 62/574,843, filed on Oct. 20, 2017, provisional application No. 62/412,192, filed on Oct. 24, 2016.

(51) Int. Cl.
*G06F 30/39* (2020.01)
*G06F 30/398* (2020.01)
*G03F 7/00* (2006.01)

(52) U.S. Cl.
CPC ............ *G06F 30/398* (2020.01); *G03F 7/705* (2013.01)

(58) Field of Classification Search
CPC ........ G06F 30/398; G06F 7/705; G06F 30/39; G06F 30/392; G03F 7/705; G03F 7/70441; G03F 7/70433; G03F 1/36; G03F 1/70
(Continued)

(56) References Cited

U.S. PATENT DOCUMENTS 5,969,441 A 10/1999 Loopstra et al.
7,587,704 B2 9/2009 Ye et al.
(Continued)

FOREIGN PATENT DOCUMENTS

| CN | 101436216 | 5/2009 |
| CN | 101727520 | 6/2010 |

(Continued)

OTHER PUBLICATIONS

International Search Report and Written Opinion issued in corresponding PCT Patent Application No. PCT/EP2017/076972, dated Jan. 29, 2018.
(Continued)

*Primary Examiner* — Paul Dinh
(74) *Attorney, Agent, or Firm* — Pillsbury Winthrop Shaw Pittman, LLP

(57) ABSTRACT

A method for optimizing a patterning device pattern, the method including obtaining an initial design pattern having a plurality of polygons, causing at least some of the polygons to be effectively connected with each other, placing evaluation features outside the boundaries of the polygons, and creating a patterning device pattern spanning across the connected polygons based on the evaluation features.

20 Claims, 31 Drawing Sheets

(58) Field of Classification Search
USPC .......................................... 716/52–54, 54–54
See application file for complete search history.

(56) References Cited

U.S. PATENT DOCUMENTS

| | | | |
|---|---|---|---|
| 2005/0153217 A1 | 7/2005 | Izuha et al. | |
| 2005/0278686 A1* | 12/2005 | Word ................... | G06F 30/398 716/53 |
| 2006/0143590 A1* | 6/2006 | Beale .................. | G03F 7/70441 716/53 |
| 2008/0127027 A1* | 5/2008 | Gallatin .................. | G03F 1/36 716/52 |
| 2009/0157360 A1 | 6/2009 | Ye et al. | |
| 2011/0150343 A1* | 6/2011 | Agarwal ................ | G06V 10/46 382/199 |
| 2011/0161895 A1* | 6/2011 | Reid ..................... | G06F 30/398 716/53 |
| 2011/0318672 A1 | 12/2011 | Ogadhoh et al. | |
| 2012/0185807 A1* | 7/2012 | Tsai ..................... | G06F 30/398 716/52 |
| 2012/0254813 A1 | 10/2012 | Chen et al. | |
| 2013/0326434 A1* | 12/2013 | Feng ........................ | G03F 1/70 716/52 |
| 2013/0326437 A1 | 12/2013 | Liu et al. | |
| 2015/0178431 A1 | 6/2015 | Arai | |
| 2017/0010538 A1 | 1/2017 | Hansen | |
| 2017/0053055 A1* | 2/2017 | Cheng ..................... | G03F 1/36 |

FOREIGN PATENT DOCUMENTS

| | | |
|---|---|---|
| CN | 102841509 | 12/2012 |
| CN | 104395828 | 3/2015 |
| CN | 105992975 | 10/2016 |
| JP | 2005181636 | 7/2005 |
| TW | I486802 | 6/2015 |

OTHER PUBLICATIONS

Taiwanese Office Action issued in corresponding Taiwanese Patent Application No. 106136452, dated Oct. 24, 2018.
Chinese Office Action issued in corresponding Chinese Patent Application No. 201780065717.6, dated Jan. 10, 2022.

* cited by examiner

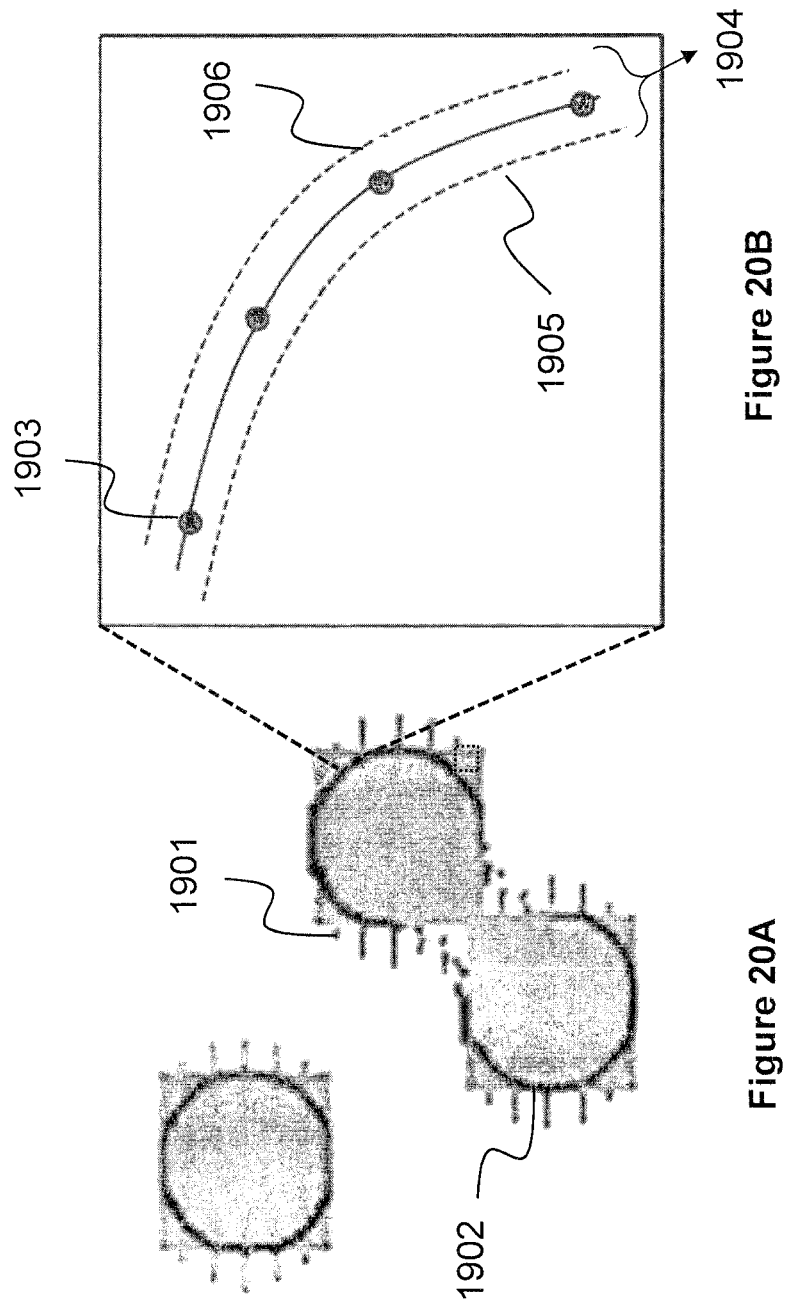

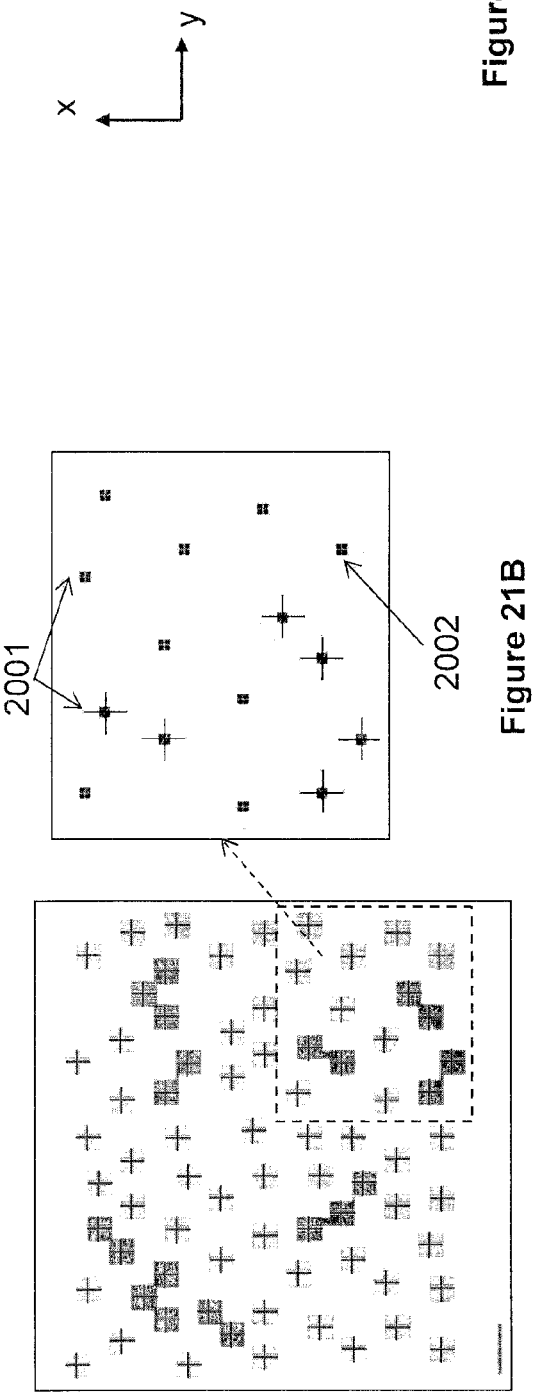
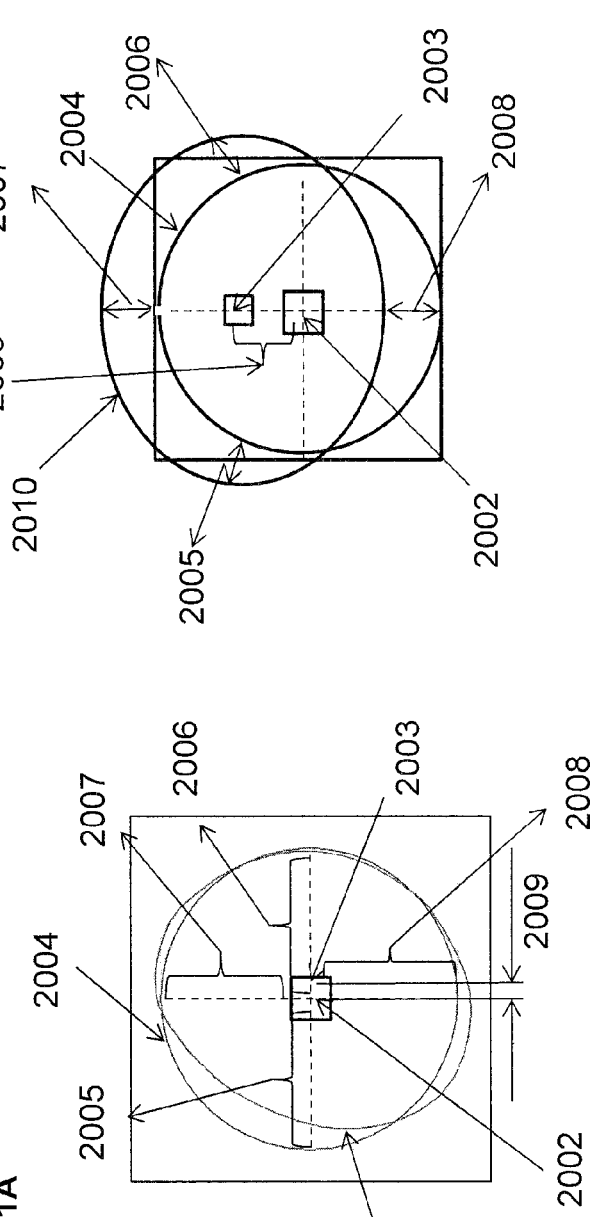

METHOD FOR OPTIMIZING A PATTERNING DEVICE PATTERN

CROSS-REFERENCE TO RELATED APPLICATIONS

This application is the U.S. national phase entry of PCT patent application no. PCT/EP2017/076972, which was filed on Oct. 23, 2017, which claims the benefit of priority of U.S. provisional application No. 62/412,192, which was filed on Oct. 24, 2016, and U.S. provisional application No. 62/574,843, which was filed on Oct. 20, 2017, both of which are incorporated herein in their entirety by reference.

FIELD

The description herein relates to lithographic methods and apparatuses, and more particularly to a method for patterning using evaluation features along a guide contour to optimize a patterning device pattern, and a system to apply the method.

BACKGROUND

A lithography apparatus can be used, for example, in the manufacture of integrated circuits (ICs). In such a case, a patterning device (e.g., a mask) may contain or provide a device pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern of the patterning device. In general, a single substrate contains a plurality of adjacent target portions to which the pattern is transferred successively by the lithography apparatus, one target portion at a time. In one type of lithography apparatuses, the pattern of the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern of the patterning device are transferred to one target portion progressively. Since, in general, the lithography apparatus will have a magnification factor M (generally <1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern of the patterning device to a substrate and typically, but optionally, involves one or more related pattern processing steps, such as resist development by a development apparatus, baking of the substrate using a bake tool, etching using the pattern using an etch apparatus, etc.

SUMMARY

In an embodiment, there is provided a method for optimizing a patterning device pattern, the method comprising: obtaining an initial design pattern having a plurality of polygons; causing at least some of the polygons to be effectively connected with each other; placing evaluation features outside the boundaries of the polygons; and creating a patterning device pattern spanning across the connected polygons based on the evaluation features.

In an embodiment, there is provided a method for optimizing a patterning device pattern, the method comprising: obtaining an initial design pattern having a plurality of polygons; causing at least some of the polygons to be effectively connected with each other; placing evaluation features with respect to the polygons; and generating a guide contour spanning across at least some of the connected polygons, wherein at least some of the evaluation features are located on the guide contour.

In an embodiment, there is provided a method for optimizing a patterning device pattern, the method comprising: obtaining an initial design pattern having a plurality of polygons; causing at least some of the polygons to be effectively connected with each other; placing evaluation features with respect to the connected polygons; and creating a patterning device pattern contour across a connection or intersection point of the connected polygons based on the evaluation features.

In an embodiment, there is provided a computer program product comprising a computer non-transitory readable medium having instructions recorded thereon, the instructions when executed by a computer implementing a method as described herein.

BRIEF DESCRIPTION OF THE DRAWINGS

FIG. 20A illustrates an example of a guide contour for placement of evaluation features (designated by short lines), and FIG. 20B illustrates evaluation features in association with a tolerance band having an upper and lower bound;

FIGS. 21A, 21B and 21C illustrate examples of the placement of pattern placement error (PPE) control gauges in more detail, wherein FIG. 21A illustrates FIG. 16, FIG. 21B illustrates placement of pattern placement error (PPE) control gauges with respect to the polygons, FIG. 21C depicts details of the workings of an embodiment of the pattern placement error (PPE) control gauges, and FIG. 21D depicts details of the workings of a further embodiment of the pattern placement error (PPE) control gauges;

FIGS. 22A and 22B illustrate an example of an optimization of the pattern and illumination mode, wherein FIG. 22A illustrates an example of an optimized pattern and FIG. 22B illustrates an example of an optimized illumination mode, and is related to process situation 1207 of FIG. 12;

DETAILED DESCRIPTION

Figure 1:
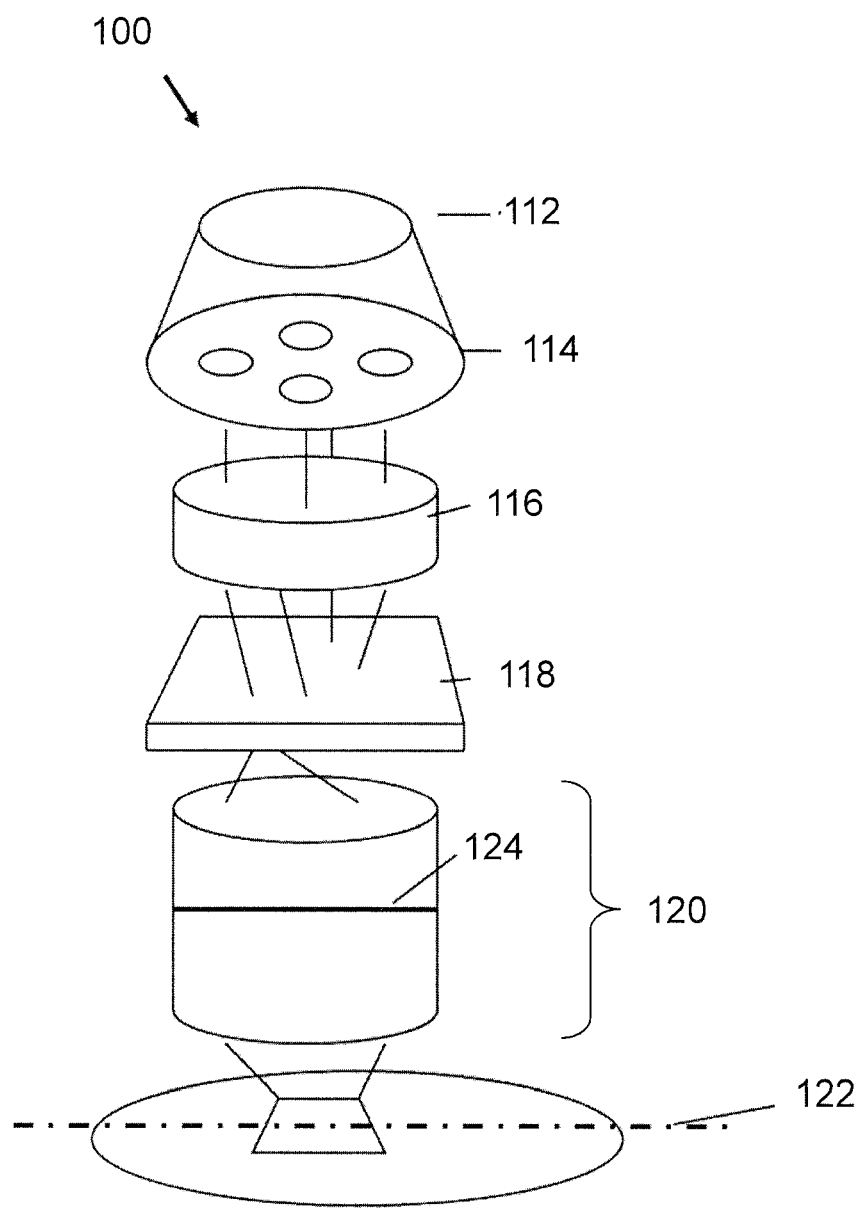
FIG. 1 illustrates a block diagram of various subsystems of a lithography system.

As a brief introduction, FIG. 1 illustrates an exemplary lithography apparatus 100. Major components are a radiation source 112, which may be a deep-ultraviolet excimer laser source or other type of source including an extreme ultra violet (EUV) source (as discussed above, the lithography apparatus itself need not have the radiation source), illumination optics which define the partial coherence (denoted as sigma) of illumination and which may include optics 114 and 116 that shape radiation from the source 112; a support to hold, or that contains, a patterning device 118; and a projection system 120 that projects an image (e.g., via one or more mirrors, one or more transmissive or reflective lenses, etc.) of the patterning device pattern onto a substrate plane 122. An adjustable filter or aperture 124 at the pupil plane of the projection system may restrict the range of beam angles that impinge on the substrate plane 122, where the largest possible angle defines the numerical aperture (NA) of the projection system NA=n sin(Θmax), n is the index of refraction of the media between the last element of projection system and the substrate, and Θmax is the largest angle of the beam exiting from the projection system that can still impinge on the substrate plane 122.

The term "projection system" as used herein should be broadly interpreted as encompassing various types of optical systems, including refractive optics, reflective optics, apertures and/or catadioptric optics, for example. The term "projection system" may also include components operating according to any of these design types for directing, shaping or controlling the projection beam of radiation, collectively or singularly.

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable CCD or LCD array.

The patterning device referred to above comprises, or can form, one or more design layouts or patterns (hereinafter design pattern for convenience). The design pattern can be generated utilizing CAD (computer-aided design) programs, this process often being referred to as EDA (electronic design automation). Most CAD programs follow a set of predetermined design rules in order to create functional design patterns/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

In an optimization process of a system, a figure of merit of the system can be represented as a cost function. The optimization process boils down to a process of finding a set of parameters (design variables) of the system that optimizes (e.g., minimizes or maximizes) the cost function. The cost function can have any suitable form depending on the goal of the optimization. For example, the cost function can be weighted root mean square (RMS) (or root mean 2n-th power, where n is a positive integer) of deviations of certain characteristics of the system with respect to the intended values (e.g., ideal values) of these characteristics; the cost function can also be the maximum of these deviations (i.e., worst deviation). The design variables of the system can be confined to finite ranges and/or be interdependent due to practicalities of implementations of the system. In the case of a lithography apparatus, the constraints are often associated with physical properties and characteristics of the hardware such as tunable ranges, and/or patterning device manufacturability design rules.

In a lithography apparatus, an illumination system provides illumination (i.e. radiation) in the form of an illumination mode to a patterning device and the projection system directs and shapes the illumination, via the patterning device, onto a substrate. The illumination mode defines the characteristics of the illumination, such as the angular or spatial intensity distribution (e.g., conventional, dipole, annular, quadrupole, etc.), an illumination sigma (a) setting, etc. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer.

A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithography apparatus (e.g., properties of the illumination mode, the patterning device and the projection system) dictate the aerial image. Since the patterning device used in the lithography apparatus can be changed, it may be desirable to separate the optical properties of the patterning device from the optical properties of the rest of the lithography apparatus including at least the illumination system and the projection system.

Figure 2:
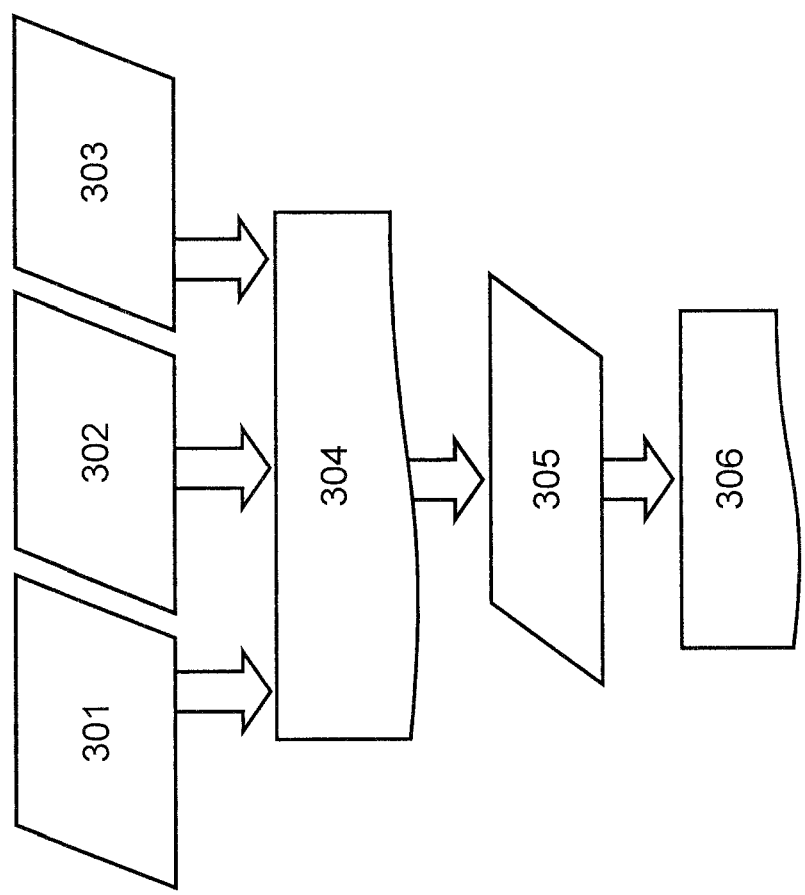
FIG. 2 illustrates a block diagram of simulation models corresponding to subsystems in FIG. 1.

An exemplary flow chart for simulating lithography in a lithography apparatus is illustrated in FIG. 2. An illumination model 301 represents optical characteristics (including radiation intensity distribution and/or phase distribution) of the illumination provided to the patterning device. A projection system model 302 represents optical characteristics (including changes to the radiation intensity distribution and/or the phase distribution caused by the projection system) of the projection system. A design pattern model 303 represents optical characteristics (including changes to the radiation intensity distribution and/or the phase distribution caused by a given design pattern 303) of a design pattern, which is the representation of an arrangement of features on or formed by a patterning device. An aerial image 304 can be simulated from the design pattern model 303, the projection system model 302 and the design pattern model 303. A resist image 306 can be simulated from the aerial image 304 using a resist model 305. Simulation of lithography can, for example, predict contours and CDs in the resist image.

More specifically, it is noted that the illumination model 301 can represent the optical characteristics of the illumination mode and/or illumination system that include, but not limited to, a numerical aperture setting, an illumination sigma (a) setting, a particular illumination shape (e.g. off-axis radiation illumination such as annular, quadrupole, dipole, etc.), etc. The projection system model 302 can represent the optical characteristics of the projection system, including aberration, distortion, one or more refractive indexes, one or more physical sizes, one or more physical dimensions, etc. The design pattern model 303 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-optical proximity correction (OPC) design pattern which can be provided in a standardized digital file format such as GDSII or OASIS or other file format.

From this design pattern, one or more portions may be identified, which are referred to as "clips". In an embodiment, a set of clips is extracted, which represents the complicated patterns in the design pattern (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design pattern, or may be similar or have a similar behavior of portions of the design pattern, where one or more critical features are identified either by experience (including clips provided by a user, e.g., chip-maker), by trial and error, or by running a full-chip simulation. Clips may contain one or more test patterns or gauge patterns.

An initial larger set of clips may be provided a priori by a user based on one or more known critical feature areas in a design pattern which require particular image optimization. Alternatively, in another embodiment, an initial larger set of clips may be extracted from the entire design pattern by using some kind of automated (such as machine vision) or manual algorithm that identifies the one or more critical feature areas.

The optimization may be directed to enlarge the process windows of some of the patterns in the design pattern. The process window of a pattern is a space of the processing parameters under which the pattern will be produced within specifications. From a mathematical point of view, a process window is a region in a vector space spanned by all the processing parameters. In a given patterning process, the process window of a pattern is dictated by the specifications of the pattern and the physics involved in the patterning process.

Using a region in a vector space spanned by all the processing parameters as the process window may not be convenient. A region of a subspace (i.e., a space spanned by fewer than all the processing parameters) may be used instead of the region the space spanned by all the processing parameters. For example, in a patterning process with many processing parameters, a region of the subspace spanned by focus and dose may be used as the process window.

Processing parameters are parameters of the patterning process. The patterning process may include processes upstream and downstream to the actual lithographic transfer of the pattern. Processing parameters may belong to a number of categories. A first category may be parameters of the lithography apparatus or any other apparatuses used in the patterning process. Examples of this category include parameters of the illumination system, projection system, substrate stage, etc. of a lithography apparatus. A second category may be parameters of any procedures performed in the patterning process. Examples of this category include focus, dose, bandwidth, exposure duration, development temperature, chemical compositions used in development, etc. A third category may be parameters of the design pattern. Examples of this category may include resolution enhancement technique (RET) or optical proximity correction adjustments such as shapes and/or locations of assist features. A fourth category may be parameters of the substrate. Examples include characteristics of structures under a resist layer, chemical composition of the resist layer, and/or physical dimensions of the resist layer. A fifth category may be parameters that represent a characteristic of temporal variation of one or more parameters of the patterning process. Examples of this category may include a characteristic of high frequency stage movements (e.g., frequency, amplitude, etc.), a high frequency laser bandwidth change (e.g., frequency, amplitude, etc.) and/or a high frequency laser wavelength change. These high frequency changes or movements are those above the response time of a mechanism to adjust the underlying parameter (e.g., stage position, laser intensity, etc.). A sixth category may be a characteristic upstream or downstream to exposure, such as post-exposure bake (PEB), development, etching, deposition, resist application, doping and/or packaging.

Various patterns in the design pattern may have different process windows. Examples of pattern specifications that relate to potential systematic defects include checks for CD, necking, line pull back, line thinning, edge placement, overlapping, resist top loss, resist undercut and/or bridging. The process window of all the patterns in the design pattern or a portion thereof may be obtained by merging (e.g., overlapping) process windows of each individual pattern.

Figure 3A:
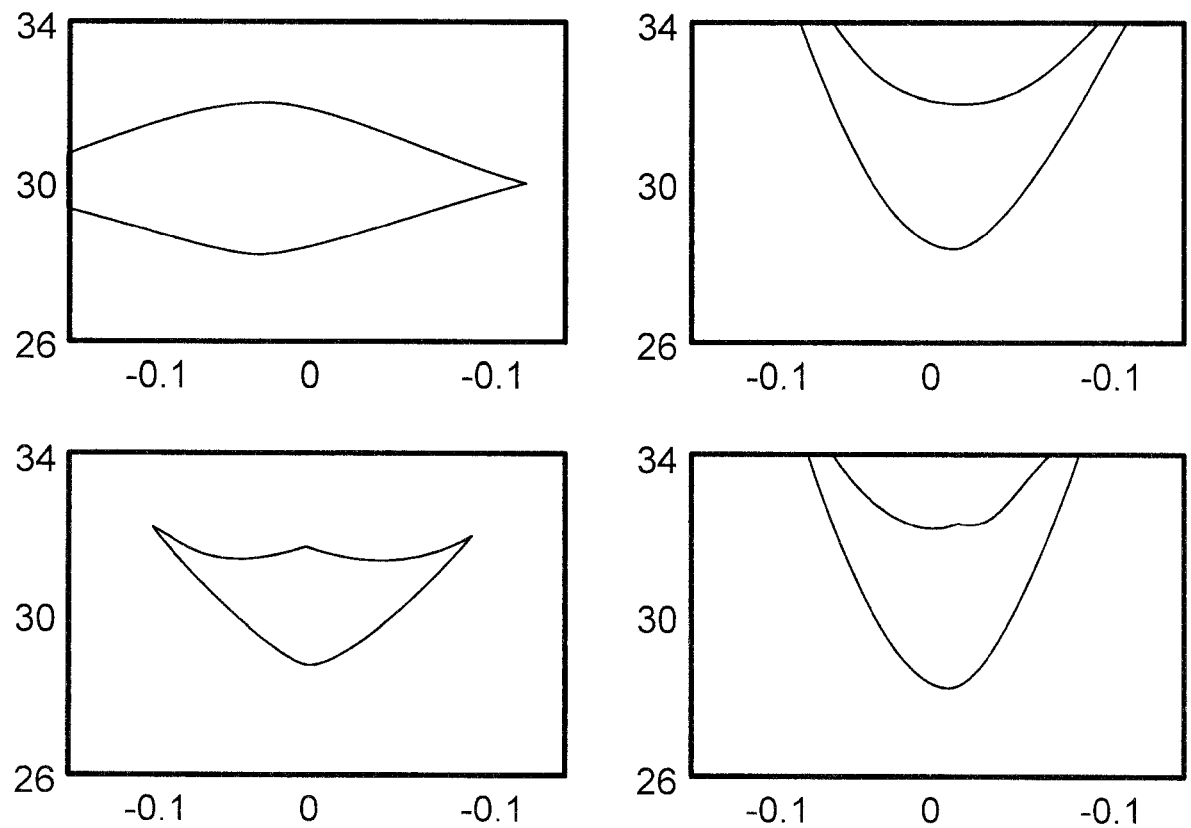
FIG. 3A illustrates process windows spanned by focus (horizontal axis) and dose (vertical axis), for EPE or CD (EPE or CD-PWs) of each of four patterns.
Figure 3B:
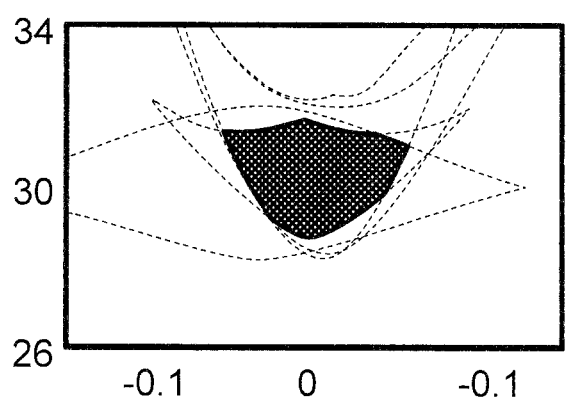
FIG. 3B illustrates a process window (represented by the dot-hatched area), spanned by focus (horizontal axis) and dose (vertical axis), of EPE or CD (EPE or CD-OPW) of the four patterns.

In an example, when the specification of a pattern only dictates the edge placement error (EPE) of the pattern, the process window of the pattern may be called an EPE process window (EPE-PW). When the specification of a pattern only dictates the EPEs of a group of patterns, the overlapping process window of the group of patterns may be called an EPE overlapping process window (EPE-OPW). An EPE-PW or EPE-OPW may be specified in terms of a finite number of parameters (e.g., 2 or 3 parameters). FIG. 3A shows process windows, spanned by focus (horizontal axis) and dose (vertical axis), of EPE (EPE-PWs) of each of four patterns. FIG. 3B shows a process window (represented by the dot-hatched area), spanned by focus (horizontal axis) and dose (vertical axis), of EPE (EPE-OPW) of the four patterns. Thus, the EPE-OPW is the overlapping area of the EPE-PWs of the four patterns. As will be appreciated, the specification of a pattern may dictate a different or additional parameter, such as CD. So, in the case of CD, the process window would become a CD process window (CD-PW) and the overlapping process window of the group of patterns may be called a CD overlapping process window (CD-OPW).

As stated above, a cost function may be used in an optimization or configuration process of a system. The cost function may represent one or more figures of merit of the system. A figure of merit of the system may be called a metric of the system. The optimization process finds a set of parameters of the system that optimizes (e.g., minimizes or maximizes) the cost function, under a certain constraint if any. When the cost function is optimized (e.g., minimized or maximized), the one or more figures of merit represented by the cost function are optimized (e.g., minimized or maximized). In a lithography apparatus, as an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a figure of merit that is a function of the design variables $(z_1, z_2, \ldots, z_N)$, such as a difference between an actual value and an intended value of a characteristic for a set of values of the design variables of $(z_1, z_2, \ldots, z_N)$. For example, $f_p(z_1, z_2, \ldots, z_N)$ may be a metric characterizing the size of a process window (e.g., CD or EPE-PW). $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithography apparatus, patterning process or the substrate, for instance, edge placement error, CD, image shift, image distortion, image rotation, stochastic variation, throughput, local CD variation, or a combination thereof. In one embodiment, the design variables $(z_1, z_2, \ldots, z_N)$ comprise one or more selected from dose, focus, bias of the patterns of the patterning device pattern, assist feature placement, spatial/angular distribution (e.g., shape such as conventional, annular, dipole, quadrupole, etc.) of illumination, etc. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$). Further, the cost function may include a function that represents one or more characteristics of any other images after exposure, such as post-develop image, after-etch image, etc. The design variables can include any adjustable parameter such as an adjustable parameter of the illumination system, the patterning device, the projection system, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithography apparatus, such as before the patterning device, near a pupil plane, near an image plane, and/or near a focal plane. The wavefront manipulator can be used to correct or compensate for one or more certain distortions of the wavefront and intensity distribution and/or phase shift caused by, for example, the illumination system, the patterning device, temperature variation in the lithography apparatus, thermal expansion of a component of the lithography apparatus, etc. Adjusting the wavefront and intensity distribution and/or phase shift can change values of one or more characteristics represented by the cost function. Such a change can be simulated from a model or actually measured. The design variables can include a parameter of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithography apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

The cost function may be repeatedly computed during the optimization process. Computing the cost function may include computing the $f_p(z_1, z_2, \ldots, z_N)$. A non-exhaustive list of examples of the $f_p(z_1, z_2, \ldots, z_N)$ that relate to an image includes one or more EPEs and functions thereof, a process window or a metric characterizing a process window, yield, a stochastic effect, presence or probability of defects, and/or an interlayer characteristic (i.e., a characteristic of a structure relative to another structure when these structures are in different layers).

With the cost function defined and its computation method obtained, the process proceeds, in an embodiment, to find a set of values of the one or more design variables, under the constraints $(z_1, z_2, \ldots, z_N) \in Z$, that optimize the cost function, e.g., to find:

$$(\tilde{z}_1, \tilde{z}_2, \ldots, \tilde{z}_N) = \arg\min_{(z_1, z_2, \ldots, z_N) \in Z} CF(z_1, z_2, \ldots, z_N) \quad \text{(Eq. 2)}$$

So, in an embodiment, there is provided methods and metrics for finding a solution (e.g., a illumination mode and pattern (SMO) optimization solution) which maximizes an overlapping edge placement error (EPE) process window for patterning (e.g., DUV and/or EUV patterning). That is, in an embodiment, the solution maximizes the size of the overlapping EPE process window, namely a process parameter space where a plurality of the parts of the pattern has an EPE better than a specification (e.g., within 5% of CD). In an embodiment, a solution found with an EPE minimization algorithm will a give near optimum overlapping EPE process window.

In an embodiment, it can be impractical to iteratively calculate the overlapping EPE process window within an optimization loop so a "shortcut metric" can be used which has strong correlation with the overlapping EPE process window and to use this in the optimization. In an embodiment, the metric comprises the process window metric described above. In an embodiment, it minimizes the maximum EPE (maximum amongst all user defined measurement cuts in the pattern) around a focus:dose variation space. Such an approach would be expected to maximize the overlapping EPE process window.

Figure 4:
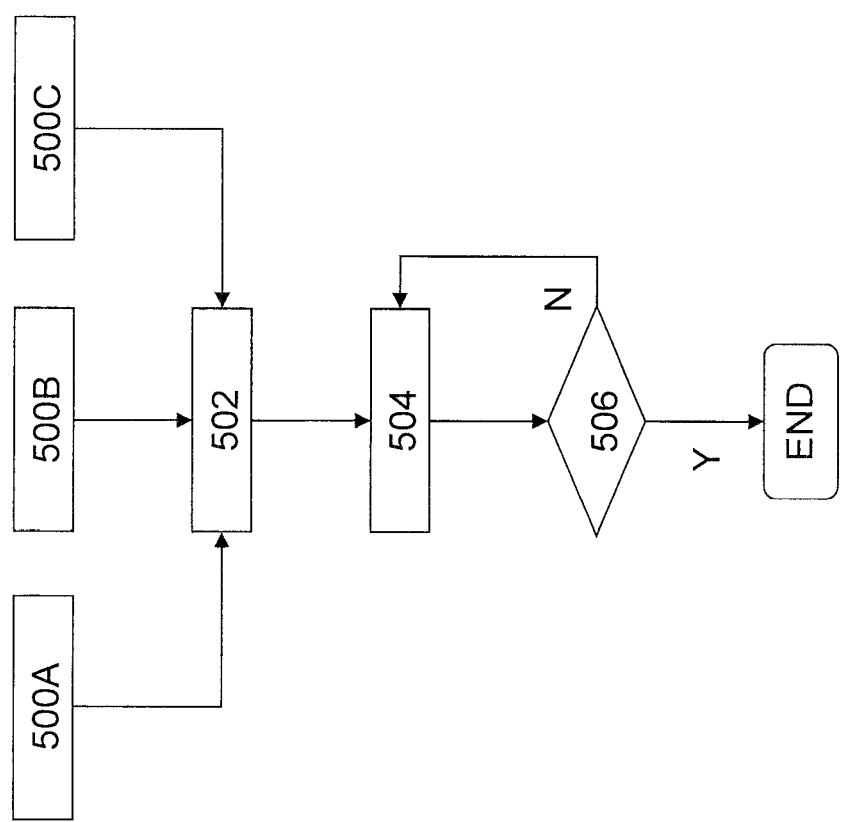
FIG. 4 illustrates a flow diagram illustrating aspects of an example of a methodology of joint optimization or co-optimization.

A general method of optimizing is illustrated in FIG. 4. This method comprises a step 502 of defining a multi-variable cost function of a plurality of design variables. The design variables may comprise any suitable combination selected from design variables representing one or more characteristics of the illumination 500A (e.g., pupil fill ratio, namely percentage of radiation of the illumination that passes through a pupil or aperture), one or more characteristics of the projection system 500B and/or one or more characteristics of the design pattern 500C. For example, the design variables may include design variables representing one or more characteristics of the illumination 500A and of the design pattern 500C (e.g., global bias) but not of one or more characteristics of the projection system 500B, which leads to an illumination-patterning device pattern (e.g., mask pattern) optimization ("source-mask optimization" or SMO). Or, the design variables may include design variables representing one or more characteristics of the illumination 500A (optionally polarization), of the projection system 500B and of the design pattern 500C, which leads to an illumination-patterning device pattern (e.g., mask)-projection system (e.g., lens) optimization ("source-mask-lens optimization" or SMLO). In step 504, the design variables are simultaneously adjusted so that the cost function is moved towards convergence. In step 506, it is determined whether a predefined termination condition is satisfied. The predetermined termination condition may include various possibilities, e.g., one or more selected from: the cost function is minimized or maximized, as required by the numerical technique used, the value of the cost function is equal to a threshold value or crosses the threshold value, the value of the cost function reaches within a preset error limit, and/or a preset number of iterations is reached. If a condition in step 506 is satisfied, the method ends. If the one or more conditions in step 506 is not satisfied, the steps 504 and 506 are iteratively repeated until a desired result is obtained. The optimization does not necessarily lead to a single set of values for the one or more design variables because there may be a physical restraint, caused by a factor such as pupil fill factor, resist chemistry, throughput, etc. The optimization may provide multiple sets of values for the one or more design variables and associated performance characteristics (e.g., the throughput) and allows a user of the lithographic apparatus to pick one or more sets.

The illumination, patterning device pattern and projection system can be optimized alternately (referred to as Alternate Optimization) or optimized simultaneously (referred to as Simultaneous Optimization). Patterns on multiple layers of the design pattern may be optimized simultaneously or alternately. The terms "simultaneous", "simultaneously", "joint" and "jointly" as used herein mean that the one or more design variables representing one or more characteristics of the illumination, patterning device, projection system and/or any other design variable, are allowed to change at the same time. The term "alternate" and "alternately" as used herein mean that not all of the design variables are allowed to change at the same time.

Figure 5:
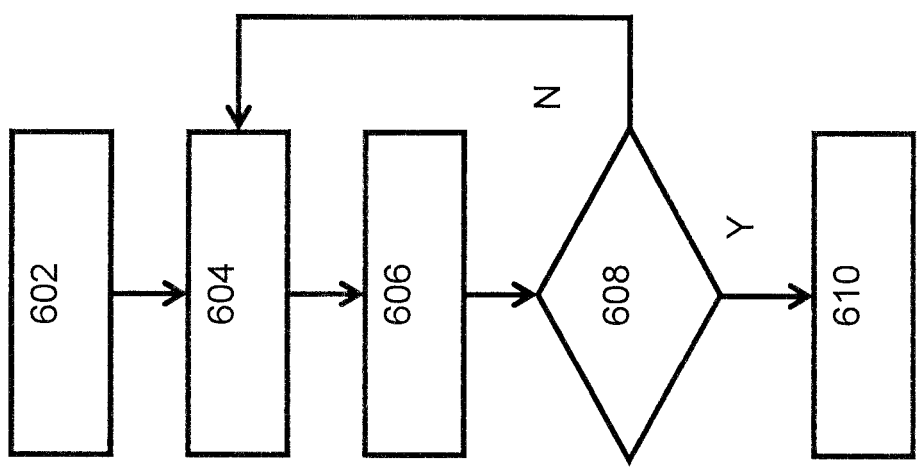
FIG. 5 illustrates an embodiment of a further optimization method, according to an embodiment.

In FIG. 4, the optimization of all the design variables is executed simultaneously. Such a flow may be called simultaneous flow or co-optimization flow. Alternately, the optimization of all the design variables is executed alternately, as illustrated in FIG. 5. In this flow, in each step, some design variables are fixed while other design variables are optimized to optimize the cost function; then in the next step, a different set of variables are fixed while the others are optimized to minimize or maximize the cost function. These steps are executed alternately until convergence or a certain terminating condition is met. As shown in the non-limiting example flowchart of FIG. 5, first, a design pattern (step 602) is obtained, then a step of illumination optimization is executed in step 604, where the one or more design variables of the illumination are optimized (SO) using the cost function while other design variables are fixed. Then in the next step 606, a patterning device (e.g., mask) optimization (MO) is performed, where the design variables of the patterning device are optimized using the cost function while other design variables are fixed. These two steps are executed alternately, until a certain terminating condition is met in step 608. One or more various termination conditions can be used, such as the value of the cost function becomes equal to a threshold value, the value of the cost function crosses the threshold value, the value of the cost function reaches within a preset error limit, a preset number of iterations is reached, etc. Note that SO-MO-Alternative-Optimization is used as an example for the alternative flow. The alternative flow can take many different forms, such as SO-LO-MO-Alternative-Optimization, where SO, LO (projection system optimization) is executed, and MO alternately and iteratively; or first SMO can be executed once, then execute LO and MO alternately and iteratively; and so on. Another alternative is SO-PO-MO (illumination optimization, polarization optimization and patterning device optimization). Finally output of the process result is obtained in step 610, and the process stops.

Figure 6:
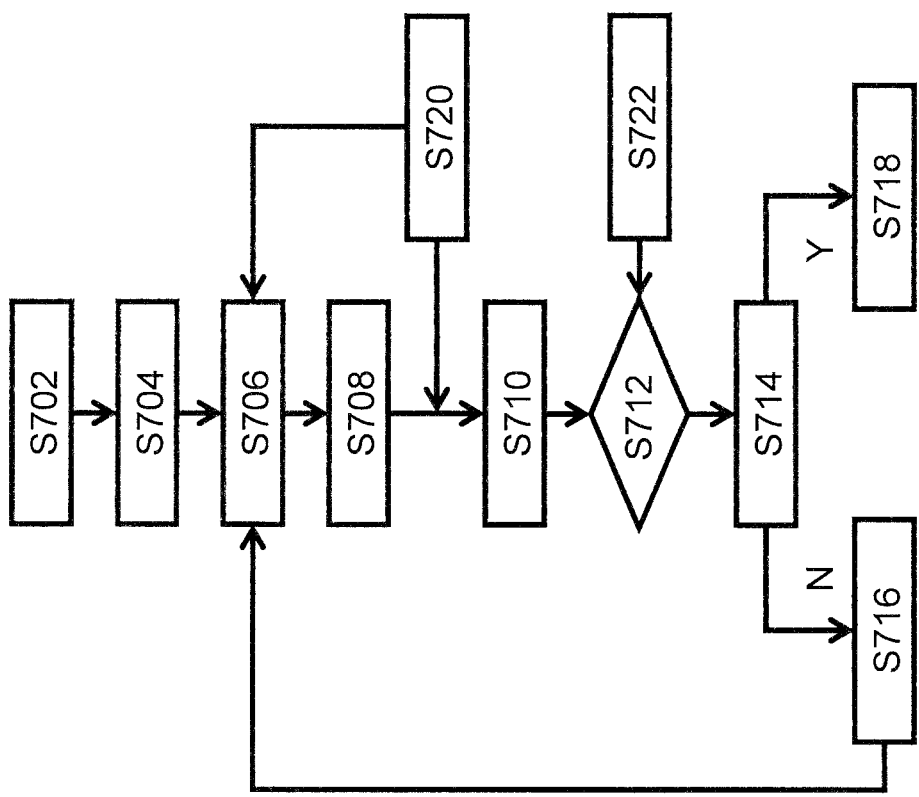
FIGS. 6, 7 and 8 illustrate exemplary flowcharts of various optimization processes.

FIG. 6 shows one exemplary method of optimization, where a cost function representing one or more characteristics of the patterning process is minimized or maximized. In step S702, initial values of one or more design variables are obtained, including one or more associated tuning ranges, if any. In step S704, the multi-variable cost function is set up. In step S706, the cost function is expanded within a small enough neighborhood around the starting point value of the one or more design variables for the first iterative step (i=0). In step S708, standard multi-variable optimization techniques are applied to the cost function. Note that the optimization problem can apply constraints, such as the one or more tuning ranges, during the optimization process in S708 or at a later stage in the optimization process. Step S720 indicates that each iteration is done for the one or more given test features (also known as "gauges") for the characteristics the cost function represents. In step S710, a lithographic response (e.g., EPE or a parameter based on EPE such as the metric described above) is predicted. In step S712, the result of step S710 is compared with a desired or ideal lithographic response value obtained in step S722. If the termination condition is satisfied in step S714, i.e. the optimization generates a lithographic response value sufficiently close to the desired value, then the final value of the design variables is outputted in step S718. The output step may also include outputting one or more other functions using the final values of the design variables, such as outputting an optimized illumination map, an optimized design pattern, a wavefront aberration-adjusted map at the pupil plane (or other planes), etc. If the termination condition is not satisfied, then in step S716, the values of the one or more design variables is updated with the result of the i-th iteration, and the process goes back to step S706. The process of FIG. 6 is elaborated in details below.

In an exemplary optimization process, no relationship between the design variables $(z_1, z_2, \ldots, z_N)$ and $f_p$ $(z_1, z_2, \ldots, z_N)$ is assumed or approximated, except that $f_p$ $(z_1, z_2, \ldots, z_N)$ is sufficiently smooth (e.g. first order derivatives $(\partial f_p(z_1, z_2, \ldots, z_N))/(\partial z_n)$, $(n=1, 2, \ldots N)$ exist), which is generally valid in a lithography apparatus. An algorithm, such as discrete optimization (e.g., "downhill" discrete optimization by pixel flipping), the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{(1(i+1))}, z_{(2(i+1))}, \ldots, z_{(N(i+1))})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{(1(i+1))}, z_{(2(i+1))}, \ldots, z_{(N(i+1))})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_1, z_2, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} (z_n = z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \quad \text{(Eq. 4)}$$

$$\sum_{p=1}^{P} w_p \bigg( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} (z_n = z_{ni}) \bigg)^2$$

which is a quadratic function of the design variables ($z_1$, $z_2$, ..., $z_N$). Every term is constant except the design variables ($z_1$, $z_2$, ..., $z_N$).

If the design variables ($z_1$, $z_2$, ..., $z_N$) are not under any constraints, ($z_{(1(i+1))}$, $z_{(2(i+1))}$, ..., $z_{(N(i+1))}$) can be derived by solving N linear equations:

$\partial CF(z_1, z_2, ..., z_N)/(\partial z_n) = 0$, wherein $n = 1, 2, ..., N$.

If the design variables ($z_1$, $z_2$, ..., $z_N$) are under constraints in the form of J inequalities (e.g. tuning ranges of ($z_1$, $z_2$, ..., $z_N$))

$$\sum_{n=1}^{N} A_{nj} z_n \leq B_j,$$

for $j = 1, 2, ..., J$; and K equalities (e.g. interdependence between the design variables)

$$\sum_{n=1}^{N} C_{nk} z_n \leq D_k,$$

for $k = 1, 2, ..., K$, the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$, can be introduced to limit the difference between ($z_{(1(i+1))}$, $z_{(2(i+1))}$, ..., $z_{(N(i+1))}$) and ($z_{1i}$, $z_{2i}$, $z_{Ni}$), so that the approximation of Eq. 3 holds. Such constraints can be expressed as $z_{ni} - \Delta_D \leq z_n \leq z_{ni} + \Delta_D$. ($z_{1(i+1)}$, $z_{2(i+1)}$, ..., $z_{N(i+1)}$) can be derived using, for example, methods described in Numerical Optimization (2nd ed.) by Jorge Nocedal and Stephen J. Wright (Berlin N.Y.: Vandenberghe. Cambridge University Press).

Instead of minimizing the RMS (or root mean 2n-th power, where n is a positive integer) of $f_p(z_1, z_2, ..., z_N)$, the optimization process can minimize magnitude of the largest deviation (the worst defect) among the characteristics to their intended values. In this approach, the cost function can alternatively be expressed as $$CF(z_1, z_2, ..., z_N) = \max_{1 \leq p \leq P} \frac{f_P(z_1, z_2, ..., z_N)}{CL_p} \quad \text{(Eq. 5)}$$

wherein $CL_p$ is the maximum allowed value for $f_p(z_1, z_2, ..., z_N)$. This cost function represents the worst defect among the characteristics. Optimization using this cost function minimizes magnitude of the worst defect. An iterative greedy algorithm can be used for this optimization. The cost function of Eq. 5 can be approximated as:

$$CF(z_1, z_2, ..., z_N) = \sum_{p=1}^{P} w_p \left( \frac{f_p(z_1, z_2, ..., z_N)}{CL_p} \right)^q \quad \text{(Eq. 6)}$$

wherein q is an even positive integer (e.g., at least 4, or at least 10). Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, ..., z_N)$. Specifically, $f_p(z_1, z_2, ..., z_N)$ is approximated as in Eq. 3. Then the constraints on worst defect size are written as inequalities $E_{Lp} \leq f_p(z_1, z_2, ..., z_N) \leq E_{Up}$, wherein $E_{Lp}$ and $E_{Up}$, are two constants specifying the minimum and maximum allowed deviation for the $f_p(z_1, z_2, ..., z_N)$. Plugging Eq. 3 in, these constraints are transformed to, for $p = 1, ..., P$, $$\sum_{n=1}^{N} \frac{\partial f_p(z_1, z_2, ..., z_N)}{\partial z_n} \bigg|_{z_1 = z_{1i}, z_2 = z_{2i}, ... z_N = z_{Ni}} z_n \leq \quad \text{(Eq. 6')}$$

$$E_{Up} + \sum_{n=1}^{N} \frac{\partial f_p(z_1, z_2, ..., z_N)}{\partial z_n} \bigg|_{z_1 = z_{1i}, z_2 = z_{2i}, ... z_N = z_{Ni}} z_{ni} - f_p(z_{1i}, z_{2i}, ..., z_{Ni})$$

and $$-\sum_{n=1}^{N} \frac{\partial f_p(z_1, z_2, ..., z_N)}{\partial z_n} \bigg|_{z_1 = z_{1i}, z_2 = z_{2i}, ... z_N = z_{Ni}} z_n \leq \quad \text{(Eq. 6'')}$$

$$-E_{Up} - \sum_{n=1}^{N} \frac{\partial f_p(z_1, z_2, ..., z_N)}{\partial z_n} \bigg|_{z_1 = z_{1i}, z_2 = z_{2i}, ... z_N = z_{Ni}} z_{ni} + f_p(z_{1i}, z_{2i}, ..., z_{Ni})$$

Since Eq. 3 is generally valid only in the vicinity of ($z_1$, $z_2$, ..., $z_N$), in case the desired constraints $E_{Lp} \leq f_p(z_1, z_2, ..., z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of ($z_1$, $z_2$, ..., $z_N$), i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th characteristic is the worst defect, $w_r$ can be increased in the (i+1)-th iteration so that the reduction of that characteristic's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = \\ (1-\lambda)\sum_{p=1}^{P} w_p f_p^2(z_1, z_2, \ldots, z_N) + \lambda \max_{1 \le p \le P} \frac{f_p(z_1, z_2, \ldots, z_N)}{CL_p} \quad \text{(Eq. 6''')}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6'' can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithography apparatus can expand the process window. A larger process window provides more flexibility in process design and chip design. The process window can be defined as, for example, a set of focus and dose values for which the resist image is within a certain limit of the design target of the resist image. Note that all the methods discussed here may also be extended to a generalized process window definition that can be established by different or additional base parameters than exposure dose and defocus. These may include, but are not limited to, optical settings such as NA, illumination sigma, optical aberration, polarization, and/or an optical constant of the resist layer. For example, as described earlier, if the process window (PW) also comprises different patterning device pattern bias (mask bias), then the optimization includes the minimization of Mask Error Enhancement Factor (MEEF), which is defined as the ratio between the substrate edge placement error (EPE) and the induced patterning device pattern edge bias. The process window defined on focus and dose values only serve as an example in this disclosure.

A method of maximizing a process window using, for example, dose and focus as its parameters, according to an embodiment, is described below. In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \varepsilon)$:

$$CF(z_1, z_2, \ldots, z_N, f_0, \varepsilon_0) \max_{(f,\varepsilon)=(f_0 \pm \Delta f, \varepsilon_0 \pm \varepsilon)} \\ \max_p |f_p(z_1, z_2, \ldots, z_N, f, \varepsilon)| \quad \text{(Eq. 7)}$$

or $$\text{or } CF(z_1, z_2, \ldots, z_N, f_0, \varepsilon_0) = \Sigma_{(f,\varepsilon)=(f_0 \pm \Delta f, \varepsilon_0 \pm \varepsilon)} \\ \Sigma_p w_p f_p^2(z_1, z_2, \ldots, z_N, f, \varepsilon)| \quad \text{(Eq. 7')}$$

or $$CF(z_1, z_2, \ldots, z_N, f_0, \varepsilon_0) = (1-\lambda)\Sigma_{(f,\varepsilon)=(f_0 \pm \Delta f, \varepsilon_0 \pm \varepsilon)} \Sigma_p w_p f_p^2 \\ (z_1, z_2, \ldots, z_N, f, \varepsilon) + \lambda \max_{(f,\varepsilon)=(f_0 \pm \Delta f, \varepsilon_0 \pm \varepsilon)} \max_p |f_p \\ (z_1, z_2, \ldots, z_N, f, \varepsilon)| \quad \text{(Eq. 7'')}$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

If the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7''. If the design variables represent one or more characteristics of the projection system, such as the Zernike coefficients, then minimizing the cost functions of Eqs. 7, 7', or 7'' leads to process window maximization based on projection system optimization, i.e., LO. If the design variables represent one or more characteristics of the illumination and patterning device in addition to those of the projection system, then minimizing the cost function of Eqs. 7, 7', or 7'' leads to process window maximizing based on SMLO, as illustrated in FIG. 4. If the design variables represented one or more characteristics of the illumination and patterning device, then minimizing the cost functions of Eqs. 7, 7', or 7'' leads to process window maximization based on SMO. The cost functions of Eqs. 7, 7', or 7'' can also include at least one $f_p(z\_1, z\_2, \ldots, z\_N)$ such as described herein, that is a function of the bandwidth.

Figure 8:
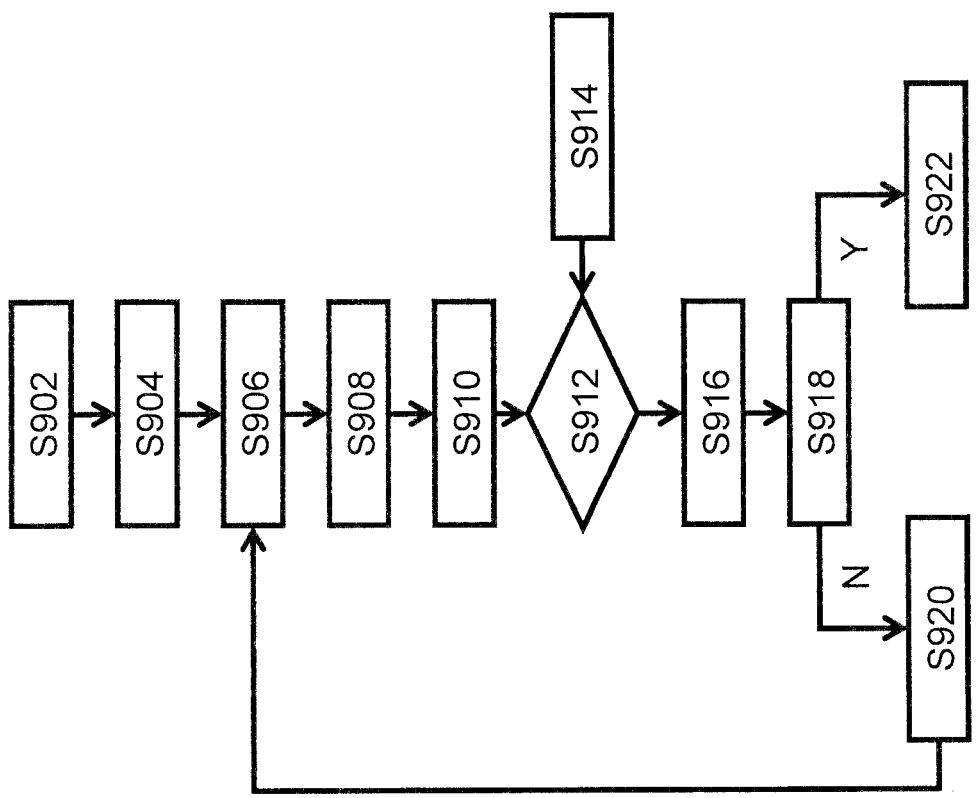

FIG. 8 shows one specific example of how a simultaneous SMLO process can use a Gauss Newton Algorithm for optimization. In step S902, starting values of one or more design variables are identified. A tuning range for each variable may also be identified. In step S904, the cost function is defined using the one or more design variables. In step S906, the cost function is expanded around the starting values of the design variables. In step S908, a suitable optimization technique is applied to minimize or maximize the cost function. In optional step S910, a full-chip simulation is executed to cover all critical patterns in a full-chip design pattern. A desired lithographic response metric (such as CD, EPE or the EPE-based metric described above) is obtained in step S914, and compared with predicted values of those quantities in step S912. In step S916, a process window is determined. Steps S918, S920, and S922 are similar to corresponding steps S914, S916 and S918, as described with respect to FIG. 8. The final output may be, for example, an optimized illumination map and/or an optimized design pattern.

Figure 7:
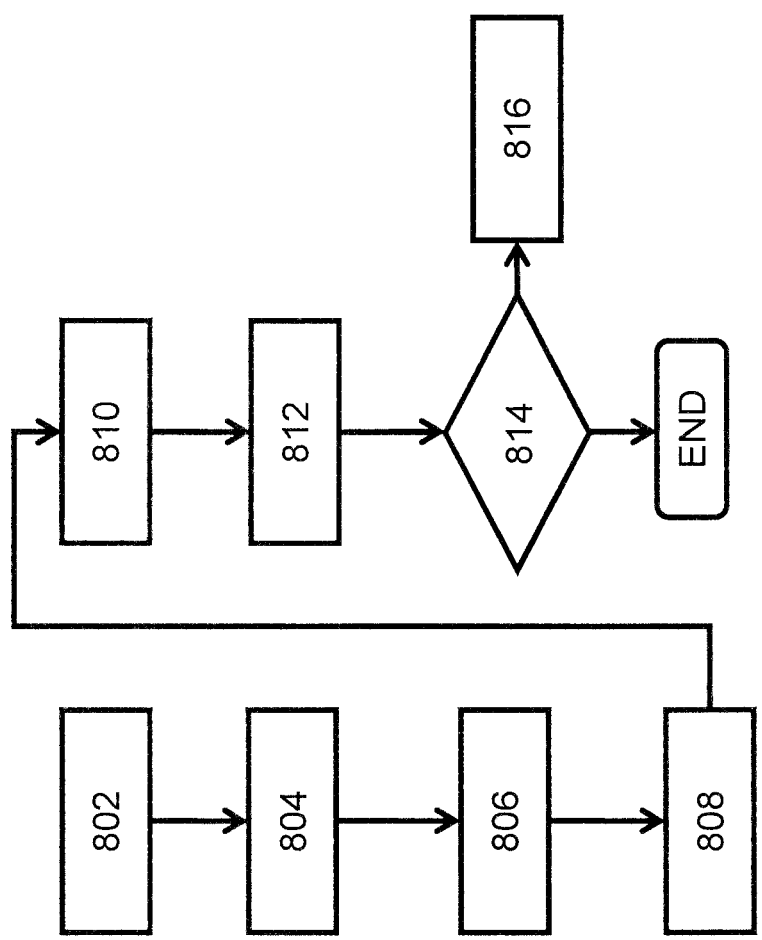

FIG. 7 shows an exemplary method to optimize the cost function where the design variables (z_1, z_2, ..., z_N) include design variables that may only assume discrete values.

The method starts by defining the pixel groups of the illumination and the patterning device tiles of the patterning device (step 802). Generally, a pixel group or a patterning device tile may also be referred to as a division of a patterning process component. In one exemplary approach, the illumination is divided into 117 pixel groups per quadrant, and 94 patterning device tiles are defined for the patterning device, substantially as described above, resulting in a total of 211 divisions.

In step 804, a lithographic model is selected as the basis for lithographic simulation. A lithographic simulation produces results that are used in calculations of one or more lithographic metrics, or responses. A particular lithographic metric is defined to be the performance metric that is to be optimized (step 806). In step 808, the initial (pre-optimization) conditions for the illumination and the patterning device are set up. Initial conditions include initial states for the pixel groups of the illumination and the patterning device tiles of the patterning device such that references may be made to an initial illumination shape and an initial patterning device pattern. Initial conditions may also include patterning device pattern bias (sometimes referred to as mask bias), NA, and/or focus ramp range. Although steps 802, 804, 806, and 808 are depicted as sequential steps, it will be appreciated that in other embodiments, these steps may be performed in other sequences.

In step 810, the pixel groups and patterning device tiles are ranked. Pixel groups and patterning device tiles may be interleaved in the ranking. Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination higher), and/or according to how an alteration of the pixel group or patterning device tile affects the performance metric.

Once the pixel groups and patterning device tiles are ranked, the illumination and patterning device are adjusted to improve the performance metric (step 812). In step 812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step 812.

In other approaches, patterning device polygon shape adjustments and pairwise polling of pixel groups and/or patterning device tiles are also performed within the optimization process of 812.

In an embodiment, the interleaved simultaneous optimization procedure may include altering a pixel group of the illumination and if an improvement of the performance metric is found, the dose or intensity is stepped up and/or down to look for further improvement. In a further embodiment, the stepping up and/or down of the dose or intensity may be replaced by a bias change of the patterning device pattern to look for further improvement in the simultaneous optimization procedure.

In step 814, a determination is made as to whether the performance metric has converged. The performance metric may be considered to have converged, for example, if little or no improvement to the performance metric has been witnessed in the last several iterations of steps 810 and 812. If the performance metric has not converged, then the steps of 810 and 812 are repeated in the next iteration, where the modified illumination shape and modified patterning device from the current iteration are used as the initial illumination shape and initial patterning device for the next iteration (step 816).

The optimization methods described above may be used to increase the throughput of the lithography apparatus. For example, the cost function may include a $f_p(z_1, z_2, \ldots, z_N)$ that is a function of the exposure time. In an embodiment, optimization of such a cost function is constrained or influenced by a measure of the bandwidth or other metric.

As noted, lithography is a significant step in the manufacturing of devices, where patterns formed on substrates define functional elements of the devices, such as microprocessors, memory chips, etc. Similar lithographic techniques are also used in the formation of other devices, such as flat panel displays, micro-electro mechanical systems (MEMS), etc.

As patterning processes continue to advance, the dimensions of functional elements have continually been reduced while the amount of functional elements, such as transistors, per device has been steadily increasing over decades. At the current state of technology, layers of devices are manufactured using lithography apparatuses that project a design pattern onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithography apparatus are printed, is commonly known as low-k1 lithography, according to the resolution formula $CD=k1\times\lambda/NA$, where $\lambda$ is the wavelength of radiation employed, NA is the numerical aperture of projection system in the lithography apparatus, CD is the "critical dimension"—generally the smallest feature size printed, and k1 is an empirical resolution factor. In general, the smaller k1 the more difficult it becomes to reproduce a pattern on the substrate that resembles the shape and dimensions planned by a circuit designer in order to achieve particular electrical functionality and performance. The lower limit value of k1 is often around 0.23 or around 0.25. Therefore, it is desired to be print features (e.g., in terms of CD of the features, in terms of pitch of the features, etc.) below the k1 limit (hereafter "sub-k1 limit" or "below the k1 limit"). To overcome these difficulties and realize sub-k1 limit pattern features, sophisticated fine-tuning steps are applied to the lithography apparatus and/or design pattern. These include, for example, but not limited to, optimization of NA and optical coherence settings, customized illumination schemes, use of phase shifting patterning devices, splitting the pattern into multiple exposures (hereinafter referring to multiple patterning), optical proximity correction (OPC, sometimes also referred to as "optical and process correction") in the design pattern, or other methods generally defined as "resolution enhancement techniques" (RET).

Figure 9:
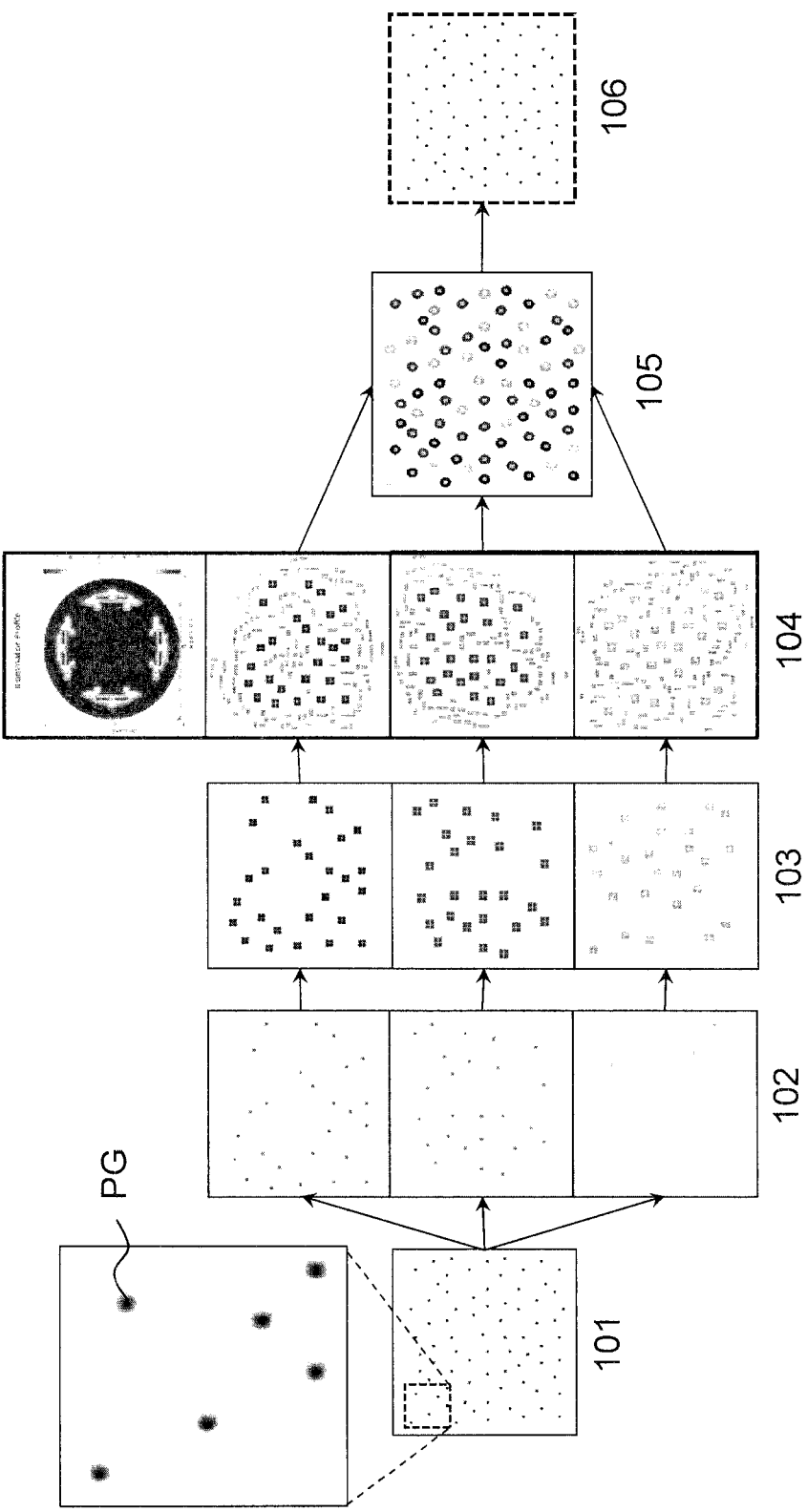
FIG. 9 illustrates a sequence of process situations of a multiple patterning technique (MPT)

As noted above, it is desired to print features in a design pattern that are not otherwise printable, i.e., print sub-k1 limit features. One method to do this is depicted in FIG. 9. In particular, FIG. 9 illustrates a sequence of processing situations 101 to 106 of design of a multiple pattering technique (MPT) to allow, for example, closely adjacent polygons PGs shown in the inset of initial design pattern 101 of FIG. 9 to be printed. In the process flow of the design of the multiple patterning technique (MPT), initial design pattern 101 is obtained. Then, a technique known in the art as coloring (in process situation 102) is carried out to split the initial design pattern into a plurality of design patterns (in this example, three design patterns), each of the plurality of design patterns to be transferred to the substrate to achieve the initial design pattern. The coloring, for example, groups polygons with pitches or separation distances not less than the k1 limit into one of the plurality of design patterns so as to avoid closely adjacent polygons PGs, e.g., with pitches or separation distances less than the k1 limit, being in the patterning device pattern. In this example, at process situation 102, three different groups of polygons are color-grouped for further processing of each of the color groups of polygons. Then, at process situation 103, size biasing of the polygons PGs is carried out in each of the color groups of polygons. Then, at process situation 104, three separate SMO processes are carried out to determine one or more optimized illumination modes (the top figure of process situation 104 shows an example of an optimized illumination mode) and the optimized patterns for providing to one or more patterning devices (the bottom three figures of process situation 104 show the three optimized design patterns with various assist features added). As is known, the patterning device pattern at process situation 104 is sized in accordance with the magnification factor of the lithographic apparatus; for example, about 4 times larger than the exposed size. Then, the patterning process is executed three times, each with one of the three patterning device patterns along with one of the one or more optimized illumination modes, so that the patterns of the three patterning device patterns are effectively layered over each other as shown at process situation 105 after the various process steps are performed (e.g., exposure, development, etc. repeated as necessary). By separately patterning the three patterning device patterns, simultaneously patterning closely adjacent features with critical dimension (CD) or pitch lower than the k1 limit is avoided. In this example, process situation 105 shows an after-development contour which results in the after-etch contour 106 of the final pattern. But, this method involves a plurality of exposures (e.g., in some cases, three patterning devices) and a plurality of optimization processes, increasing manufacturing time, cost, complexity, etc. Therefore, it is desirable, for example, to realize a patterning process that uses only one patterning device pattern, or fewer patterning device patterns, to print sub-k1 limit features.

In an embodiment, there is provided a method to perform a process of adjusting a patterning device pattern and an illumination mode that uses a custom guide contour to realize, e.g., printing of sub-k1 limit features. In an embodiment, the method can realize sub-k1 limit patterning using a single patterning device pattern through adjusting a patterning device pattern and an illumination mode with a custom guide contour in combination with appropriate post-resist development processing.

Figure 10:
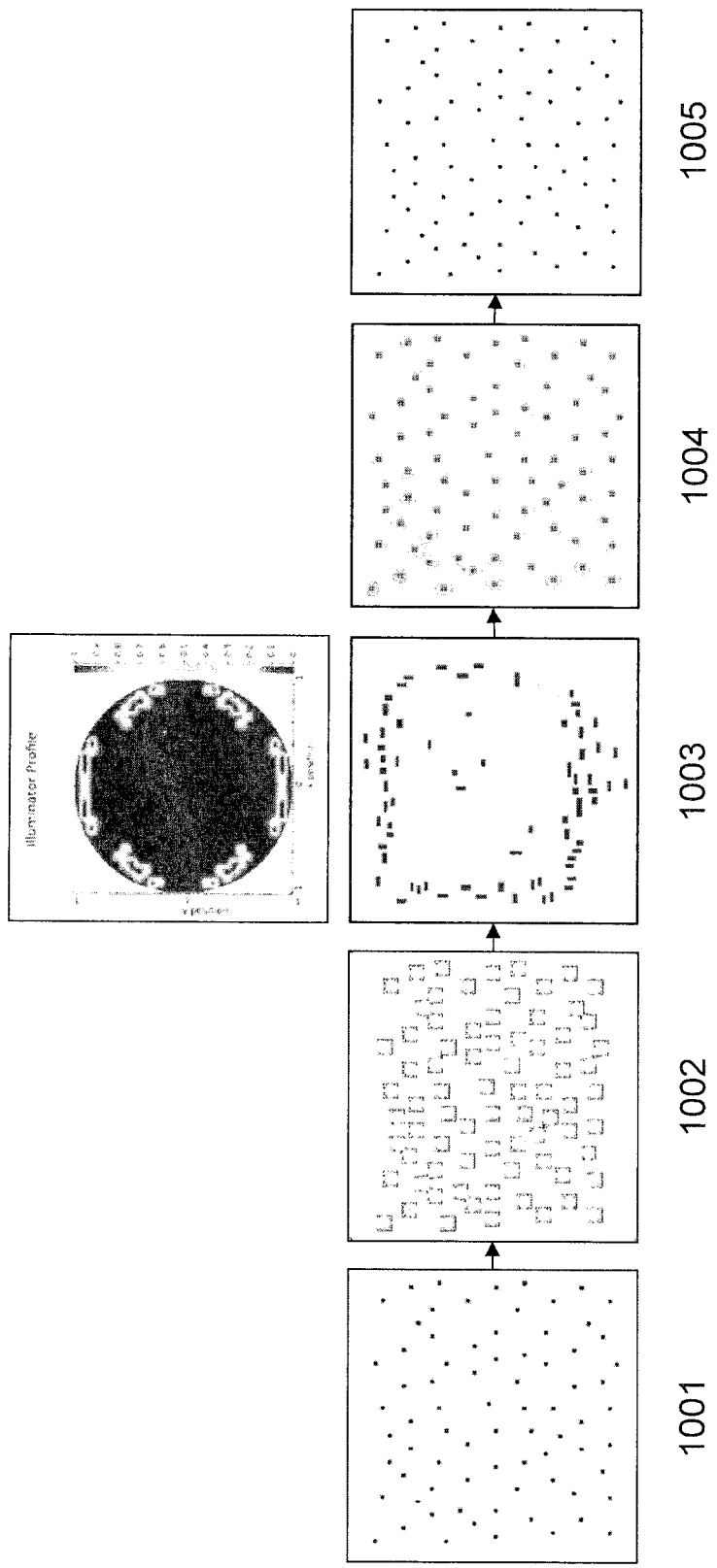
FIG. 10 illustrates an embodiment of a method.

Referring to FIG. 10, an optimization process is shown to design a pattern to print an initial design 1001 with sub-k1 features (e.g., critical dimension (CD) of feature or a separation gap, below the k1 limit) with, in this example, only one patterning device pattern and the use of that patterning device pattern to print the pattern. As discussed further below, at process situation 1002, the initial design 1001 can be reconfigured and a guide contour applied for use in an optimization (e.g., SMO) process at process situation 1003. After the optimization, process situation 1003 shows, in the bottom figure, an optimized patterning device pattern (showing main pattern features and assist features) and, in the top figure, an optional optimized illumination mode. As discussed hereafter, in an embodiment, the process at process situation 1002 and/or process situation 1003 is configured so as to produce a pattern that would not yield the initial design 1001 using a traditional development and etching procedure. Rather, the exposed patterning device is such that it can be subject to a "shrink" and/or "healing" process as described hereafter.

At process situation 1004, a post resist development contour is shown (in this case, a simulated contour) corresponding to the imaged optimized patterning device pattern at process situation 1003 using the optimized illumination mode at process situation 1003. Then, a "shrink" and/or "healing" process is applied to achieve desired pattern features. The "shrink" involves a reducing in size or dimension of a feature. In an embodiment, the "shrink" involves selective deposition, for example, selective sidewall deposition that can "shrink" a pattern feature in the resist and/or in an etched layer. Selective deposition can involve deposition of block copolymer for use in self-assembly into separate domains/phases. The "healing" process involves an increase in a size or dimension of a feature. In an embodiment, the "healing" process involves selective etching, for example, selective etching of a certain pattern feature in the resist and/or in an etched layer. In an embodiment, the selective etching can be a combination of a selective deposition that "shrinks" a feature (e.g., a contact hole or other recess) below the desired size or dimension and then the selective etch of the feature "heals" the feature to the desired size or dimension. An appropriate "shrink" and/or "healing" process model can be used to guide the pattern optimization process (for example, to help define the design pattern to be produced by the optimization process) and/or one or more "shrink" and/or "healing" parameters can be used in the optimization process (for example, a joint, alternative or simulation optimization as discussed above). At process situation 1005, an after-etch contour of the final pattern (in this case, a simulated contour using a "shrink" and/or "healing" process model) is depicted that corresponds to the post resist development contour at process situation 1003 that has been subject to an appropriate "shrink" and/or "healing" process.

Figure 11:
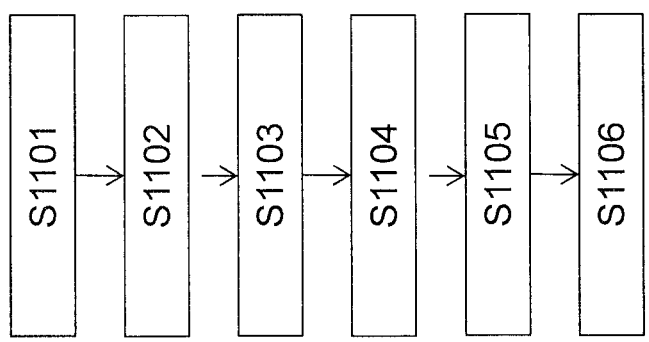
FIG. 11 illustrates a flow chart of the method of FIG. 10.

Referring to FIG. 11, an embodiment of a process flow for enabling printing of sub-k1 limit features using an optimization process and a guide contour is depicted. The process may include, starting from an initial design pattern comprising a plurality of polygons, identifying target polygons that are below the k1 limit (e.g., with critical dimension (CD) less than the k1 limit, with a pitch with respect to another polygon below the k1 limit) and effectively connecting the target polygons (e.g. growing, expanding or biasing their shape (hereinafter referred to as biasing)) so as to create a rectangular or other shape that includes the identified target polygons (step S1101). If, after biasing, one or more identified target polygons remain separated then those one or more unconnected target polygons may be bridge to other identified target polygons (step S1102). One or more pattern placement gauges may be applied with respect to one or more of the identified target polygons and/or with respect to one or more other polygons of the design pattern (step S1103). A smoothing technique may be applied to connected target polygons to create a guide contour to enable placement of evaluation features (e.g., evaluation points, evaluation segments, evaluation areas, etc.) for use in guiding an optimization process, and optionally, a tolerance band may be added for use with the evaluation features in the optimization process. Or, a plurality of evaluation features for use in guiding an optimization process can be identified (e.g., by a user) and then a smoothing technique may be applied to provide a guide contour through the evaluation features (step S1104). Then, an optimization (e.g., SMO) process may be carried out create an optimized design pattern (and optionally an optimized illumination mode) to print a desired contour at the substrate, wherein the optimization process can be an edge placement error cost function analysis based on the evaluation features (step S1105). Optionally, a model for a healing and/or shrink process (e.g., an etch and/or deposition model) may be used to optimize the creation of the optimized design pattern or can be used to generate a representation of a final printed pattern, which is desirably accurate to the initial design pattern (step S1106).

Figure 12:
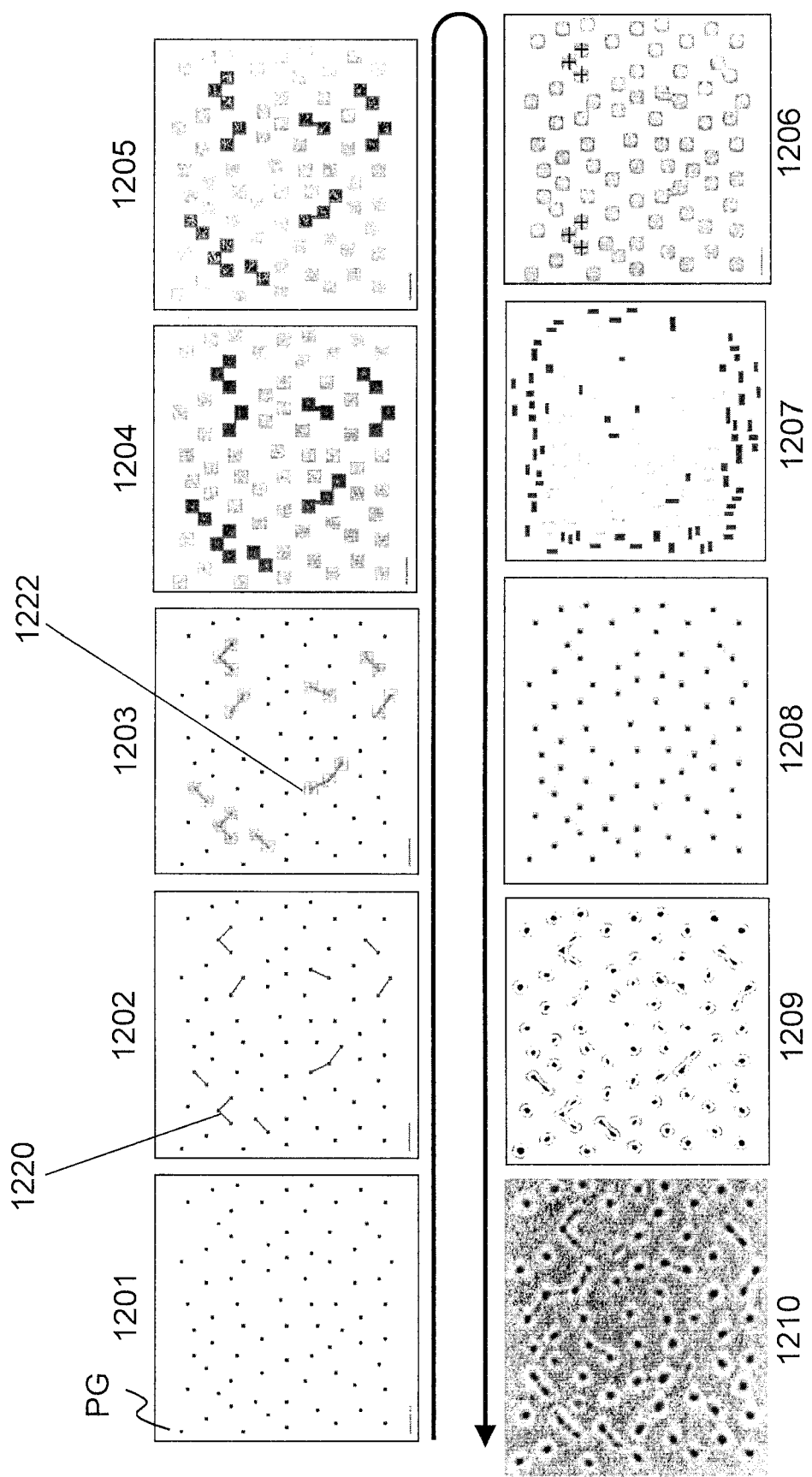
FIG. 12 illustrates an example of a sequence of processing situations of the method of FIG. 11.

FIG. 12 illustrates an embodiment of the method of FIG. 11 in more detail with a curved arrow line indicating the direction of the process. At process situation 1201, an initial design pattern may be obtained to indicate the coordinates of features (the features can be vias, through holes, contact holes, or any other features). The features will be referred to herein as polygons.

At process situation 1202, adjacent polygons having a separation distance or pitch less than the k1 limit are identified as target polygons. For example, as marked at 1220 at process situation 1202, three adjacent polygons are identified by lines connecting them to form an inverted V-shape wherein the lines merely signify how the polygons will become connected subsequently. Of course, those lines need not be created. The polygons can be identified/marked in any fashion. Also, the adjacent polygons need not have a separation distance or pitch less than the k1 limit, e.g., in the case of an EUV process.

At process situation 1203, the identified target polygons are effectively connected. Effectively connected means an identified target polygon touches or partially overlaps another identified target polygon or their separation is reduced to a distance below a certain threshold. In an embodiment, the identified target polygons can be biased to enable connection. That is, in an embodiment, the shapes of the identified and adjacent target polygons are enlarged so as to connect at least one of the identified target polygons with another adjacent identified target polygon at at least one vertex. In an embodiment, all the identified target polygons are uniformly biased so that the shapes may be enlarged to a same extent. In an embodiment, different biasing can be applied to different combinations of identified target polygons to enable connection. In an embodiment, if one or more adjacent identified target polygons are not connected after biasing (e.g., a rule prevents further biasing, one or more identified target polygons are already connected after biasing (e.g., a uniform biasing), etc.), a relatively narrow 'bridge' (e.g., an assist or connection polygon) may be added either automatically by the system or manually by the user or through an input file or other resource to connect the nearest vertices of the identified target polygons. An example of target polygons in this situation is marked as 1222 in process situation 1203.

At the process situation 1204, polygons not identified may be biased, for example, in a similar way as the identified polygons at process situation 1203. However, the polygons here are not biased to necessarily connect with, or become close enough for connection with, one or more other polygons.

At process situation 1205, one or more pattern placement gauges may be optionally applied with respect to one or more of the polygons. More details of the pattern placement gauges will be provided hereafter.

Figure 22B:
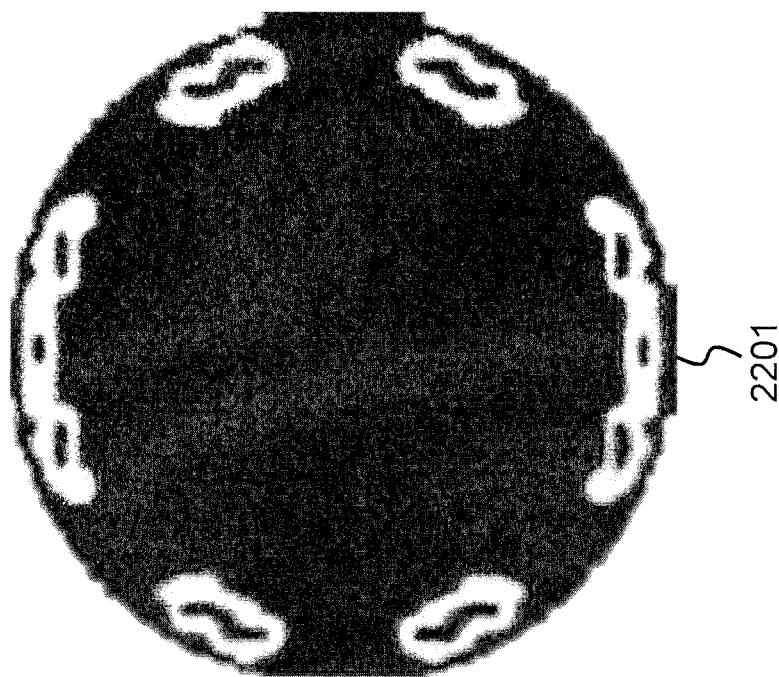

At process situation 1206, evaluation features (for example, shown here in the form of short lines) are placed with respect to a plurality of the polygons. In an embodiment, one or more of the evaluation features are placed outside the boundaries of the polygons and in an embodiment, near identified and connected target polygons. In an embodiment, a guide contour can be generated with respect to identified and connected target polygons and the evaluation features are located along the guide contour; the guide contour essentially is the target to which the patterning device pattern contour is designed in the optimization process. In an embodiment, a plurality of evaluation features for use in guiding the optimization process can be identified (e.g., by a user) and then a smoothing technique may be applied to provide a guide contour through the evaluation features. In an embodiment, evaluation features are placed on the non-identified polygons. In an embodiment, one or more evaluation features can be provided outside the boundaries of the polygons and near the non-identified polygons. The evaluation features can be user specified or system generated for evaluation of the patterning device pattern contour as described hereafter At process situation 1207, an optimization process is performed based on the evaluation features to realize a patterning device pattern as shown at process situation 1207. That is, in an embodiment, a patterning device pattern contour (and optionally resolution enhancement technique (RET) or optical proximity correction adjustments such as assist features) is generated with respect to the polygons based on the evaluation features. In an embodiment, the optimization process is a SMO based on a cost function using the evaluation features, such as a cost function using the ASML Tachyon software. In an embodiment, the optimization process is an edge placement error (EPE)-based SMO. An example of an optimized illumination mode obtained at process situation 1207 is shown in FIG. 22B. Optionally, the optimization process is performed based on the pattern placement gauges to determine a pattern placement error. In an embodiment, the optimization process is an edge placement error (EPE) and pattern placement error (PPE)-based SMO. By using the evaluation features, the patterning device pattern contour may be simulated to extend within as well as extend outside the identified and connected target polygons. In an embodiment, the patterning device pattern contour spans across vertices of adjacent identified and connected target polygons at their point of connection by virtue of the patterning device pattern contour and/or the evaluation features.

In an embodiment, the optimization process can yield an intermediate patterning device pattern that is evaluated against the guide contour. This can be useful, for example, where the evaluations points are not highly dense. Thus, one or more parts, areas, shapes, etc. of the intermediate patterning device pattern is evaluated against the guide contour to determine deviation therefrom. Based on such evaluation, the optimization process can be modified. For example, the weights of one or more evaluations points can be changed. As another example, one or more additional or differently located evaluation points can be considered in the optimization process. So, in an embodiment, an iterative process can be performed to evaluate the patterning device pattern against the guide contour and alter the optimization process accordingly.

At process situation 1208, a resist pattern created by an actual or simulated exposure of the resist using the optimized patterning device pattern contour at process situation 1207 is developed. An example of such a resist pattern is depicted at process situation 1208.

At process situation 1209, a shrink and/or healing process is applied to the developed resist pattern. In an embodiment, the shrink and/or healing process can be an actual shrink (e.g., selective deposition) and/or healing (e.g., selective etch) process, and the results compared against the initial design pattern. In an embodiment, a shrink and/or healing process can be simulated. In an embodiment, a shrink and/or healing process model can be used to help set the desired pattern at process situation 1207 and/or can be used in an optimization to set one or more parameters of the shrink and/or healing process. Desirably, the final pattern after the shrink and/or healing process is close to, or accurate with, the initial design pattern. As seen in the figures at process situation 1209, a simulated final pattern closely corresponds to the initial design pattern at process situation 1201.

At process situation 1210, an image of an example of a pattern is shown adjacent to the simulated figure at process situation 1209. The image at process situation 1210, after a shrinking and healing process, fairly closely matches the simulated image at process situation 1209.

The steps of FIGS. 11 and 12 are described in further detail below.

Figure 13:
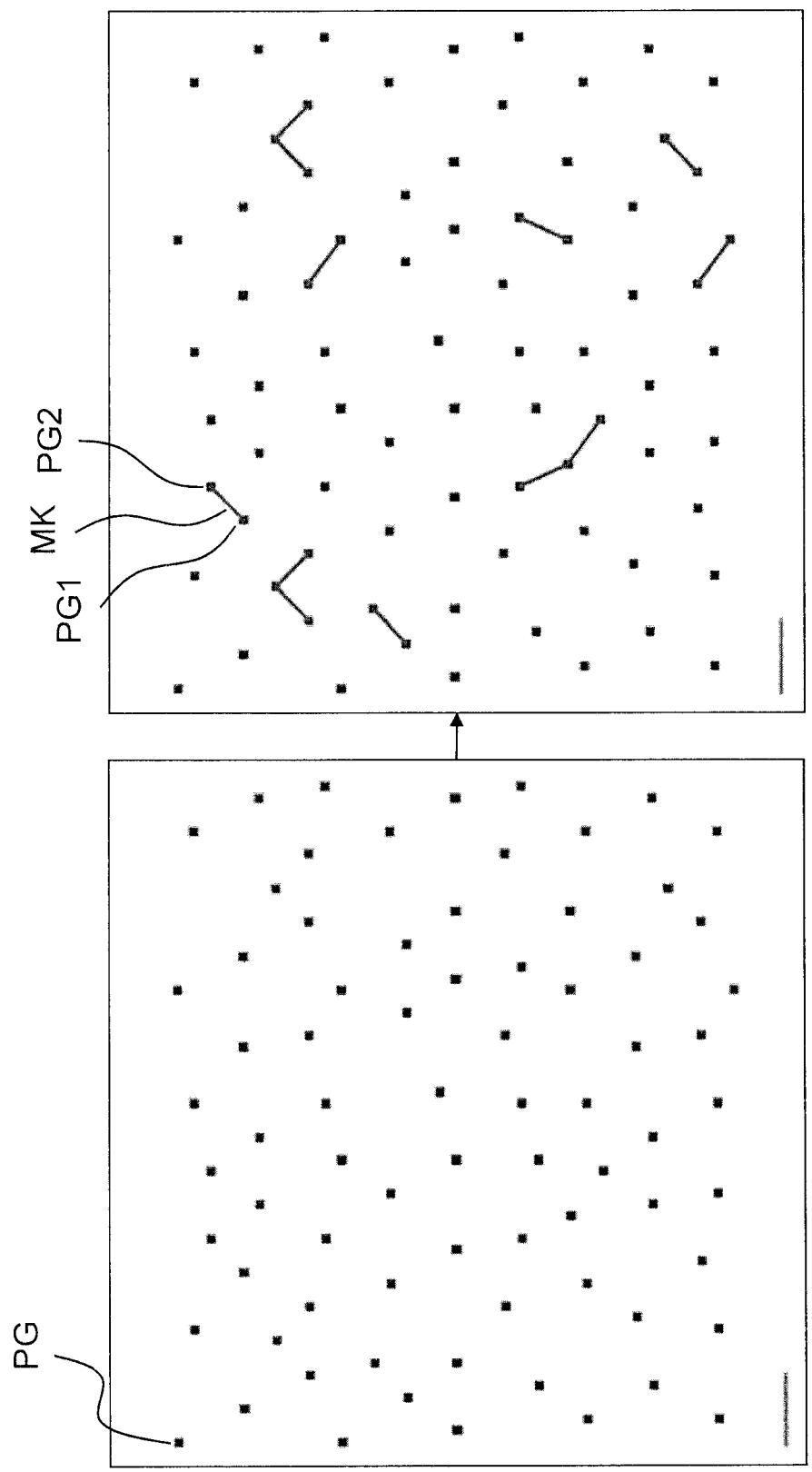
FIGS. 13A and 13B illustrate examples of a process of identifying closely adjacent target polygons at process situation 1202 of the method of FIG. 12.

FIG. 13A illustrates an initial design pattern at process situation 1201 of the processing flow of FIG. 12 and FIG. 13B illustrates an example of a method of identifying closely adjacent target polygons at the process situation 1202. An example of an initial design pattern having features PG (hereinafter polygons) is shown in FIG. 13A. The polygons may be initially supplied or created, from a non-polygon layout, based on user defined parameters and/or a specific or general mathematical model (written in a computer language such as C or C++ or constructed using Mathematica software, LabView software, MatLab software, etc.). For example, in an embodiment, the coordinates of the polygons can be stored in a text file inputted to the system so as to locate the exact positions of the polygons in the initial design pattern. In an embodiment, a center of each polygon can be specified or calculated by the software. The calculation of the shape center of polygons may be based on one or more mathematical models and/or based on one or more user-defined parameters.

Referring to the FIG. 13B, in the process flow, closely adjacent polygons such as polygons PG1 and PG2 are identified. In an embodiment, closely adjacent polygons are automatically identified by software of the process. Additionally or alternatively, a user can identify one or more closely adjacent polygons. Whether polygons are closely adjacent can be evaluated against a nearest distance between the adjacent polygons or within ±10% of the nearest distance.

To show the identification of closely adjacent polygons, markers MK are depicted FIG. 13B. In practice, markers MK need not be constructed or depicted; here they offer the convenience of easy visual identification of closely adjacent polygons and help symbolize how those closely adjacent polygons can become connected as discussed hereafter. FIG. 13B shows how closely adjacent polygons PG1 and PG2 are identified as target polygons by marking with a marker MK.

To identify closely adjacent polygons as identified target polygons, one or more different criteria can be used. In an embodiment, closely adjacent polygons, such as polygons PG1 and PG2, are identified as those having a pitch or separation distance meeting a certain criteria, e.g., below a certain limit such as less than the k1 limit (where the k1 limit is, for example, 0.28). The criteria (e.g., the pitch or separation distance limit) can be set by the user or generated by the software for the process. The criteria can be applied to all polygons in a design pattern, or can vary for different regions and/or different polygons of a design pattern. The identifying of polygons can use Boolean operations to identify the target polygons.

Further, due to, e.g., variation within the patterning process, polygons can be identified that are close to the k1 limit yet greater than or equal to the k1 limit, that is, within a certain acceptable range from the k1 limit. In an embodiment, a tolerance range with upper and lower bounds can be specified by the user, or generated by the software, to identify closely adjacent polygons, that is, the pitch, separation distance, CD, etc. can be within a range of values, or selected from a plurality of specific values, defined by the user or generated by the software.

Figure 14:
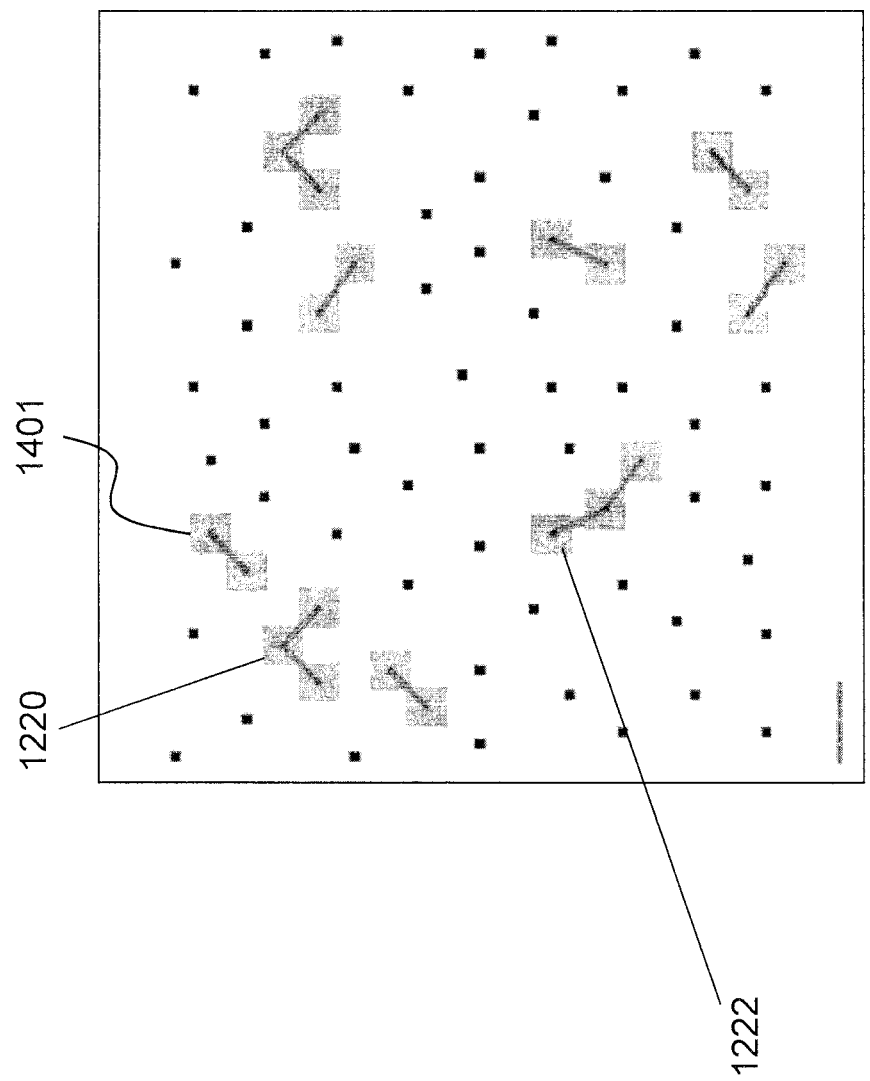
FIG. 14 illustrates example of biasing of identified closely adjacent target polygons at process situation 1203 of FIG. 12 and optionally forming a bridge to connect identified and biased target polygons that are not connected to each other after biasing.

FIG. 14 illustrates connecting one or more identified closely adjacent target polygons at the process situation 1203 of FIG. 12. In an embodiment, the identified closely adjacent target polygons (e.g. polygons PG1 and PG2) are biased to expand the polygon size. The biasing can be performed for all the target polygons in the design pattern or can be selectively performed for specific target polygons or regions of target polygons. The extent of size biasing can be uniform for all target polygons or can be selectively applied with one or more different extents of size biasing to specific target polygons or regions of target polygons. The extent of size biasing can be controlled to be different in different directions or the same in all directions (that is, the expanded biased polygon may have the same shape as the shape before biasing, but the biased polygon has a different size from the polygon before biasing). The flexibility of biasing can be controlled by the user or by the software.

In an embodiment, the biasing is controlled to connect adjacent identified target polygons. For example, the extent of size biasing can be increased until at least two adjacent identified target polygons connect (e.g., vertices effectively touch (i.e., they actually touch or come very close) or the polygons slightly overlap). So, for example, the biasing process expands the polygons 1401 until they connect (e.g., the vertices effectively touch). Similarly, the polygons 1220 can be biased until one or more of those polygons connect (e.g., the vertices effectively touch). If a pair of identified adjacent target polygons becomes connected during the biasing but one or more other identified adjacent target polygons are not connected at that time, cannot be connected because further biasing causes too much overlap, cannot be connected because of possible violation of a design rule, etc., the one or more other identified adjacent target polygons can be connected by a bridging connection as discussed herein. The number of identified target polygons that become connected to each other after biasing can be controlled by the user or by the software.

As highlighted above, whether after biasing or not, for example after uniform biasing for all identified target polygons, one or more identified target polygons may not be connected to one or more other adjacent identified target polygons. These one or more unconnected target polygons after size biasing could nevertheless be close to one or more other adjacent identified target polygons.

In this situation or in a situation where there was no biasing, a bridge may be applied to connect the one or more unconnected target polygons to one or more other adjacent identified target polygons. The bridge can take any appropriate shape or form. In an embodiment, the bridge can have a rectangular shape or any other shape to connect the adjacent identified target polygons. In an embodiment, the shape or form of the bridge can be defined by the user or generated by the software. In an embodiment, the bridge extends from a vertex and/or side of the unconnected target polygon to a nearest vertex and/or side of the adjacent target polygon. Typically, the bridge extends from a vertex of the unconnected target polygon to a nearest vertex of the adjacent target polygon, but the bridge can extend from a side of the unconnected target polygon to a nearest side of the adjacent target polygon. In an embodiment, the bridge can include portions of one or more sides of the target polygons adjacent the vertices. In an embodiment, the starting point of extending the bridge and the destination point of ending the bridge may be defined by the user or generated by the software. In an embodiment, the width of the bridge in a direction perpendicular to the extension direction of the bridge can be defined by a user or by the software.

Figure 15:
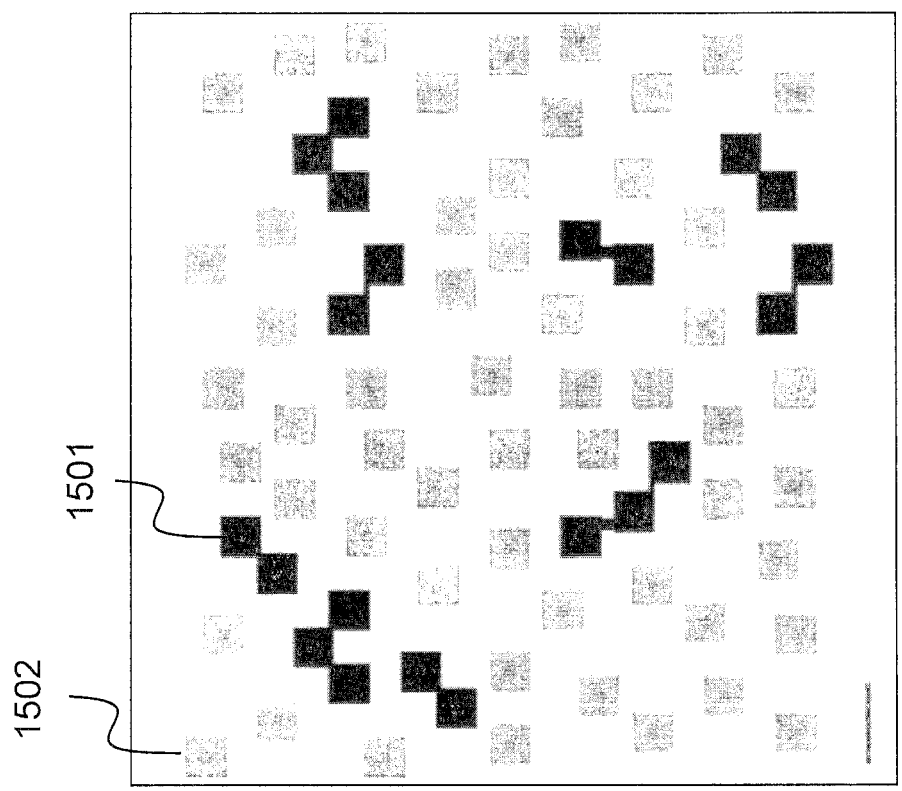
FIG. 15 illustrates an example of biasing non-identified target polygons at process situation 1204 of FIG. 12.

FIG. 15 illustrates a process of biasing non-identified target polygons at process situation 1204 of FIG. 12. FIG. 15 shows a biased identified target polygon 1501 and a non-identified polygon 1502. The size biasing of the non-identified polygons may have the same criteria or different criteria from the size biasing of the identified target polygons. The criteria for biasing of the non-identified polygons can be controlled by the user or by the software. Desirably, the non-identified polygons are not biased to connect with another polygon since they do not fulfill the criteria of being closely adjacent. Nevertheless, one or more non-identified polygons may be biased to connect with an identified target polygon or to another non-identified polygon. Similarly, if one or more non-identified polygons are biased to come close to an identified target polygon or to another non-identified polygon, a bridge may be automatically or manually generated in a similar method as described herein for identified target polygons. An appropriate shrink and/or heal process can then be implemented in the patterning process so as to create a desired final pattern.

Like with biasing of target polygons, the biasing of non-identified polygons can be performed for all the non-identified polygons in the design pattern or can be selectively performed for specific non-identified polygons or regions of non-identified polygons. The extent of size biasing can be uniform for all non-identified polygons or can be selectively applied with one or more different extents of size biasing to specific non-identified polygons or regions of non-identified polygons. The extent of size biasing can be controlled to be different in different directions or the same in all directions (that is, the expanded biased polygon may have the same shape as the shape before biasing, but the biased polygon has a different size from the polygon before biasing). The flexibility of biasing can be controlled by the user or by the software.

In an embodiment, the size biasing of the identified and/or non-identified polygons enables creating contours at the substrate of increased size than a traditional resist exposure, development and etch process, so that in combination with a shrink and/or heal process after exposure, the features of the final pattern can brought to the right size and shape corresponding to the initial design pattern.

Figure 16:
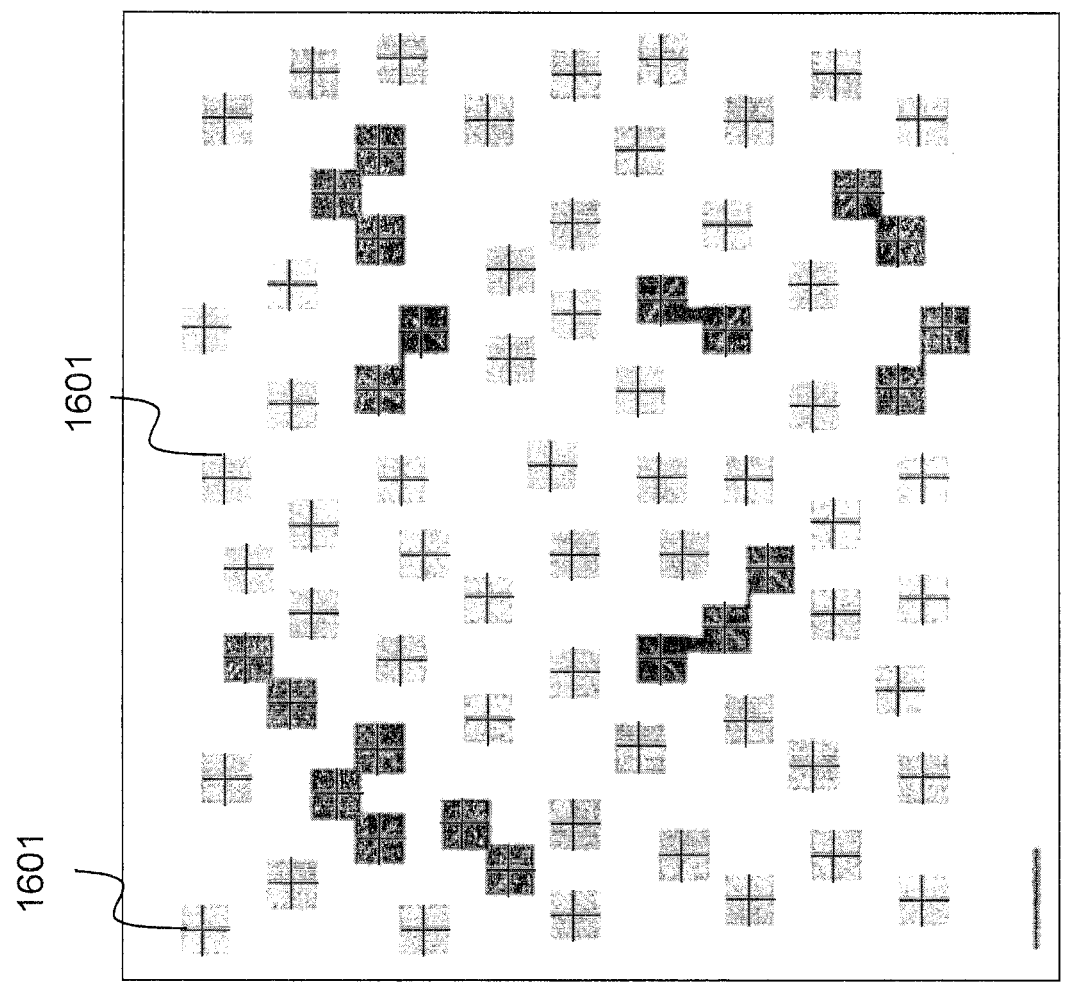
FIG. 16 illustrates an example of providing pattern placement gauges with respect to one or more polygons at process situation 1205 of FIG. 12.

FIG. 16 illustrates the optional step of providing one or more pattern placement gauges with respect to polygons at the process situation 1205 of FIG. 12. As described further herein, the pattern placement gauges are aimed at controlling the x and/or y displacement of a centroid of the patterning device pattern contour corresponding to the polygon(s). The pattern placement gauges can be provided with respect to all polygons or select polygons. In an embodiment, pattern placement gauges are provided for at least identified target polygons that are connected. While pattern placement gauges are shown as being applied at the process situation 1205, they can be provided at other points in the process. The pattern placement gauges 1601 are shown as perpendicular lines to identify the directions that they are used to "measure." The pattern placement gauges can measure in different directions, e.g., in one or more diagonal directions to those shown. Further, different polygons can have gauges that "measure" in different directions. For example, connected polygons can have gauges that measure in a diagonal direction with respect to the polygon, i.e., the pattern placement gauges can be diagonal between vertices of such a polygon.

Figure 17:
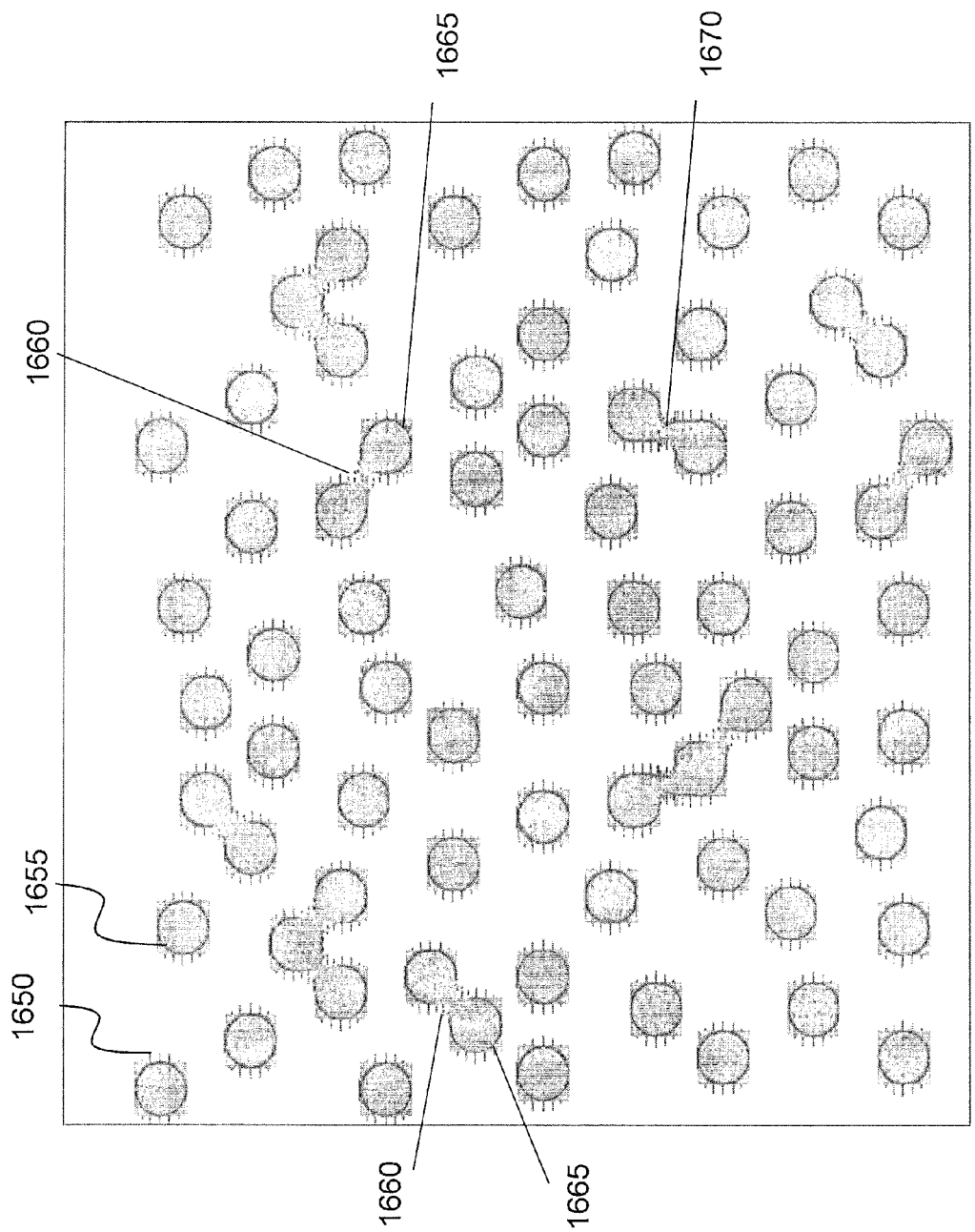
FIG. 17 illustrates an example of placement of evaluation features for the polygons, including one or more evaluation features outside identified target polygons, at process situation 1206 of FIG. 12.

FIG. 17 shows applying evaluation features with respect to the polygons at process situation 1205, wherein the evaluation features are shown as short lines 1650 intersecting a guide contour 1655 defined with respect to the polygons. The evaluation features are used to evaluate, for example, edge placement error of a patterning device pattern contour defined with respect to its associated one or more polygons (e.g., with respect to the contour for the polygon(s)). Evaluations features (and a guide contour) can be applied within the individual polygons, such as the non-identified polygons.

In an embodiment, one or more evaluation features are applied outside the boundaries of the polygons as shown at 1660. To help enable this placement, a guide contour 1665 can be defined (e.g., fitted by one or more appropriate fitting algorithms) across connected polygons and/or across identified evaluation features. The evaluation features can be located along this guide contour and can include one or more evaluation features outside the boundaries of the polygons.

Figure 18:
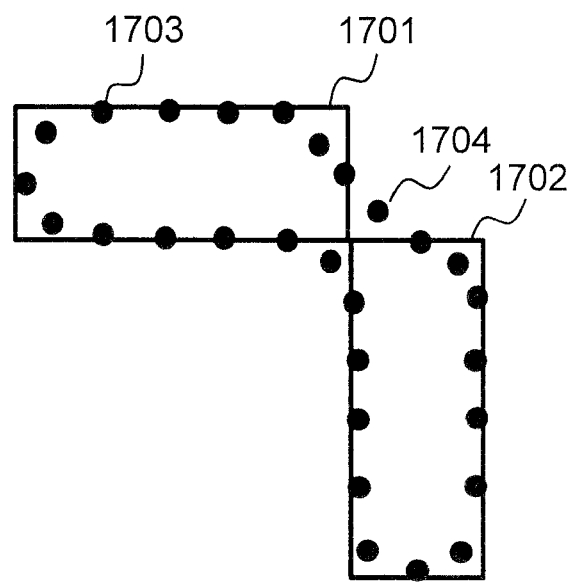
FIG. 18 illustrates an example of the placement of evaluation features in respect of some of the identified target polygons, in relation to the process situation 1206 of FIG. 12.
Figure 19:
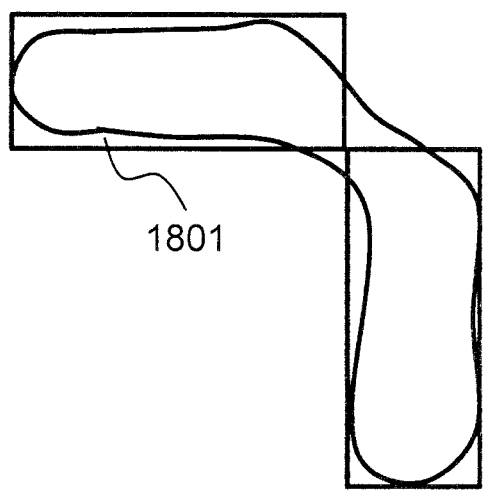
FIG. 19 illustrates an example of a guide contour for placing of the evaluation features, at process situation 1206 of FIG. 12.

FIG. 18 shows a closer view of closely adjacent polygons 1701 and 1702. For this situation, the separation distance between the closely adjacent polygons 1701 and 1702 was less than the k1 limit prior to biasing and so they were biased to connect at respective vertices. In this example, evaluation features 1703 (shown here as dots rather than short lines) are applied in the polygon 1701 and in the polygon 1702. Further, one or more evaluation features 1704 are placed outside the boundaries of the polygons 1701 and 1702 at the location wherein the gap was lower than the k1 limit. So, with the placement of the evaluation features in this manner, the patterning device pattern contour generated as part of a pattern optimization process based on the evaluation can cross the connection points of the polygons 1701 and 1702. This applying of evaluation features outside the polygon can also be performed in situations where a bridge is formed between the polygons. The applying of evaluation features outside the polygons may not be restricted to the closely adjacent polygons 1701 and 1702. The location of evaluation features outside the boundaries of the polygons can be controlled by the user or generated by the software.

To enable the formation of a patterning device pattern spanning across effectively connected polygons, a guide contour can be fitted across the connected polygons (e.g., it can be fitted across identified evaluation points (e.g., identified by a user) or be created by a fitting algorithm through the connected polygons subject to various fitting rules). Thus, a custom guide contour is realized that spans across the connected polygons, rather than one that is wholly defined with a single polygon. One or more fitting algorithms or smoothing techniques can be used to create the custom guide contour. The evaluation features are located along the custom guide contour. FIG. 18 indicates an example of a custom guide contour 1801 of connected polygons, and along which evaluation features would be located. In an embodiment, a pattern optimization process would create, based on the evaluation features, a patterning device pattern contour that would closely match this custom guide contour. However, many factors (such as other nearby polygons and their imaging) can cause the patterning device pattern contour generated based on the evaluation features to deviate from this custom guide contour.

In an embodiment, the evaluation features could be wholly within the connected polygons. For example, the guide contour can defined within the body of the connected polygons and a bridge connecting the polygons such as 1670 in FIG. 17. But, the evaluation features (and the optional custom guide contour) are arranged such that the patterning device pattern contour generated by the pattern optimization process crosses across the vertices and/or sides of the adjacent polygons where the polygons intersect or otherwise connect such that generated patterning device pattern contour spans across the connection points of the connected polygons.

So, due to the placement of evaluation features and/or the guide contour, a patterning device pattern contour is generated that spans across formerly separate polygons to enable printing of closely adjacent polygons. The contour at the substrate, generated using the patterning device pattern contour, can be modified using a shrink and/or heal process to realize pattern features corresponding to the individual polygons.

To enable the generation of the patterning device pattern contour, a pattern optimization process can be used to generate the patterning device pattern contour and/or one or more resolution enhancement technique (RET) or optical proximity correction adjustments (e.g., assist features). To enable the optimization, a simulation can be performed to simulate the patterning process. An objective of the simulation is to accurately predict, for example, edge placement, aerial image intensity slope, critical dimension (CD), etc., which can then be compared against an intended design as part of the optimization.

In an embodiment, the optimization comprises an edge placement error (EPE)-based patterning device pattern optimization. In an embodiment, the optimization comprises an illumination mode and patterning device pattern optimization (SMO). The SMO can be an edge placement error (EPE)-based SMO.

As described above, a cost function may be used in an optimization or configuration process of a pattern. The cost function may represent one or more figures of merit of the patterning process. The optimization process finds a set of parameters of the system that optimizes (e.g., minimizes or maximizes) the cost function, under a certain constraint if any. When the cost function is optimized (e.g., minimized or maximized), the one or more figures of merit represented by the cost function may be optimized (e.g., minimized or maximized). The cost function may represent any one or more suitable characteristics of the lithography apparatus, patterning process or the substrate, for instance, edge placement error, critical dimension (CD), image shift, image distortion, image rotation, stochastic variation, throughput, local critical dimension (CD) variation, or a combination thereof. The design variables can include any adjustable parameter such as an adjustable parameter of the illumination mode, the patterning device pattern, the projection system, dose, focus, etc.

An EPE-based cost function for am optimization (e.g., SMO) may be expressed as:

$$CF(v_{src}, v_{mask}, v_{wavefront}, v_{design}) = \sum_{pw,eval} w(pw, eval) \|EPE_{pw,eval}\|^p + p_{sidelobe} + p_{slope} + p_{mrc} + P_{src} + \ldots \quad \text{(Eq. 8)}$$

wherein the cost function CF is in this case specified in terms one or more selected from: one or more variables of the illumination mode ($v_{src}$), one or more variables of creating the patterning device pattern ($v_{mask}$), one or more variables of the wavefront (e.g., the projection system) ($v_{wavefront}$) and/or one or more variables of the intended design pattern ($v_{design}$). Further, pw corresponds to the process window conditions simulated (e.g., focus and dose metric), eval corresponds to the evaluation features placed within the design pattern, w is a weighting factor for the particular process window condition pw and/or evaluation feature eval, EPE is edge placement error being evaluated for the particular combination of process window condition pw and evaluation feature eval, index p is a natural number for the approximation of the cost function CF, $P_{sidelobe}$ is a penalty corresponding to undesired side edge printing of the pattern, the slope of the edge of the simulated contour based on the applied evaluation features, $P_{slope}$ is a penalty corresponding to the image slope (e.g., image log slope) of the pattern image, $P_{MRC}$ is a penalty corresponding to one or more patterning device manufacturing rule checks, and $P_{src}$ is a penalty corresponding to the design of the illumination mode. As will be appreciated, less (including none), more or different penalties can be applied.

Referring to FIG. 20A, an example of a guide contour 1902 is depicted along with evaluation features 1901 (in the form of short lines intersecting the guide contour). Further, FIG. 20B illustrates the evaluation features 1903 (shown as dots corresponding to the intersection points of the lines 1901 with the contour 1902) are depicted within a tolerance band 1904 having an upper bound 1906 and a lower bound 1905. The tolerance band 1904 can be specified by the user or generated by the software. The tolerance band 1904 can vary around the guide contour such that different evaluation features can have a different tolerance band size. The tolerance band need not be centered on an evaluation feature such that a size of the tolerance band can vary on opposite sides of an evaluation feature, as specified by a user or by the software. The tolerance band is used with respect to the optimization process to decide whether the patterning device pattern contour should be shifted or not at the evaluation feature. For example, if the edge placement error at the evaluation feature is within the tolerance band at the evaluation feature, then that edge placement error is effectively is not considered by the cost function. However, if the edge placement error at the evaluation feature is outside the tolerance band at the evaluation feature, then that edge placement error is penalized as part of the cost function. Thus, the tolerance band can enable a limited amount of process variation at the evaluation features.

In an embodiment, the optimization process can yield an intermediate patterning device pattern that is evaluated against the guide contour. This can be useful, for example, where the evaluations points are not highly dense. Thus, one or more parts, areas, shapes, etc. of the intermediate patterning device pattern is evaluated against the guide contour to determine deviation therefrom. Based on such evaluation, the optimization process can be modified. For example, the weights of one or more evaluations points can be changed. As another example, one or more additional or differently located evaluation points can be considered in the optimization process. So, in an embodiment, an iterative process can be performed to evaluate the patterning device pattern against the guide contour and alter the optimization process accordingly.

FIGS. 21A, 21B and 21C illustrate the placement of pattern placement error (PPE) control gauges in more detail. FIG. 21A illustrates FIG. 16. FIG. 21B illustrates placement of pattern placement error (PPE) control gauges with respect to certain polygons identified by the broken line box in FIG. 21A. Pattern placement error (PPE) control gauges 2001 are shown with respect to an ideal center or centroid 2002 of an associated one or more polygons. The PPE control gauges may be placed by a user or by the software. As discussed above, the PPE control gauges can be arranged in a perpendicular arrangement as shown, but is not limited to such an arrangement (e.g., the PPE control gauges can be placed along a diagonal with respect to a polygon). FIG. 21B further shows the guide contours prior to application of evaluation features.

FIG. 21C depicts details of the workings of an embodiment of the pattern placement error (PPE) control gauges. FIG. 21C shows a guide contour 2004, which is the ideal to which a patterning device pattern contour should be created as part of the optimization process. Further, the ideal center or centroid 2002 of the patterning device pattern contour or a part thereof is shown. It is desired that the center or centroid of the optimized patterning device pattern contour does not move from, or moves relatively little, from the ideal centroid or center. Accordingly, a first pattern placement error gauge 2007 can determine a distance between the centroid/center and the patterning device pattern contour 2010 as determined as part of the optimization process in the positive X direction and a second pattern placement error gauge 2008 can determine a distance between the centroid/center and the patterning device pattern contour 2010 as determined as part of the optimization process in the negative X direction. A difference between the values for the first and second pattern placement error gauges can give a shift in the X direction. Similarly, a third pattern placement error gauge 2006 can determine a distance between the centroid/center and the patterning device pattern contour 2010 as determined as part of the optimization process in the positive Y direction and a fourth pattern placement error gauge 2005 can determine a distance between the centroid/center and the patterning device pattern contour 2010 as determined as part of the optimization process in the negative Y direction. A difference between the values for the third and fourth pattern placement error gauges can give a shift in the Y direction. Thus, in this example, the gauges can show that the center or centroid 2003 of the expected patterning device pattern contour as printed can shift 2009 from the ideal center or centroid 2002.

As will be appreciated, all four gauges need not be provided. For example, only two gauges could be provided. Or, more than four gauges can be provided.

Further, the gauges need not "measure" from the ideal center or centroid. They can, for example, measure from the guide contour (or an associated evaluation feature) to the patterning device pattern contour. An example of this is shown in FIG. 21D. FIG. 21D depicts details of the workings of an embodiment of the pattern placement error (PPE) control gauges. FIG. 21D shows a guide contour 2004, which is the ideal to which a patterning device pattern contour should be created as part of the optimization process. Further, the ideal center or centroid 2002 of the patterning device pattern contour is shown. It is desired that the center or centroid of the optimized patterning device pattern contour does not move from, or moves relatively little, from the ideal centroid or center. Accordingly, a first pattern placement error gauge 2007 in the form of an edge placement error can determine a distance between the guide contour 2004 and the patterning device pattern contour 2010 as determined as part of the optimization process in the top direction (e.g., in the positive X direction) and a second pattern placement error gauge 2008 in the form of an edge placement error can determine a distance between the guide contour 2004 and the patterning device pattern contour 2010 as determined as part of the optimization process in the bottom direction (e.g., in the negative X direction). A difference between the values for the first and second pattern placement error gauges can give a shift in the top and bottom direction (e.g., X direction). Similarly, a third pattern placement error gauge 2006 in the form of an edge placement error can determine a distance between the guide contour 2004 and the patterning device pattern contour 2010 as determined as part of the optimization process in the right direction (e.g., the positive Y direction) and a fourth pattern placement error gauge 2005 in the form of edge placement error can determine a distance between the guide contour 2004 and the patterning device pattern contour 2010 as determined as part of the optimization process in the left direction (e.g., negative Y direction). A difference between the values for the third and fourth pattern placement error gauges can give a shift in the left and right direction (e.g., Y direction). Thus, in this example, the gauges can show that the center or centroid 2003 of the expected patterning device pattern contour as printed can shift 2009 from the ideal center or centroid 2002.

So, in an embodiment, the pattern placement error can be analyzed as part of the pattern process optimization (e.g., to minimize pattern placement error). Pattern placement error (PPE) can cause an overlay error in the patterning process, possibly leading to defective devices. So, a patterning device pattern contour can be further optimized based on a cost function that includes pattern placement error (PPE). So, in an embodiment, the optimization comprises a pattern placement error (PPE)-based patterning device pattern optimization. In an embodiment, the optimization comprises an illumination mode and patterning device pattern optimization (SMO). The SMO can be a pattern placement error (PPE)-based SMO.

In an embodiment, the optimization comprises an edge placement error (EPE) and pattern placement error (PPE)-based patterning device pattern optimization. In an embodiment, the optimization comprises an illumination mode and patterning device pattern optimization (SMO). The SMO can be an edge placement error (EPE) and pattern placement error (PPE)-based SMO.

For example, an example of a cost function based on edge placement error (EPE) and pattern placement error (PPE) can have the following form:

$$CF = \Sigma_{pw,e} w_{pw,e}(EPE^p + wPPE^p) \qquad \text{(Eq. 9)}$$

wherein e corresponds to the various evaluation features, pw corresponds to the various process windows conditions, EPE is the edge placement error evaluation, PPE is the pattern placement error evaluation, and w is a weighting factor between EPE and PPE. Thus, this cost function can tune the parameters to obtain an optimal patterning device pattern contour for a design pattern with consideration of pattern placement error (PPE).

Figure 22A:
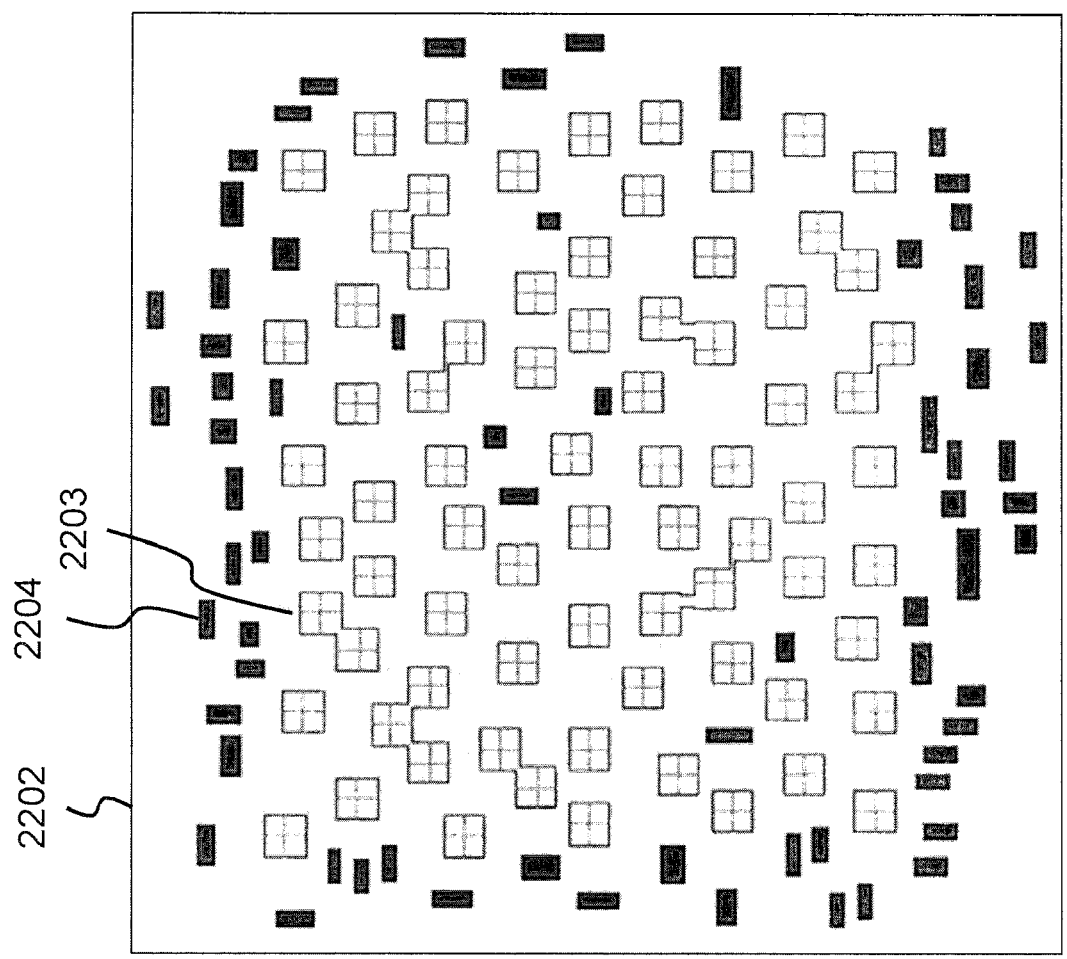

FIGS. 22A and 22B illustrate an optimization of the pattern and illumination mode, wherein FIG. 22A illustrates an example of an optimized pattern 2202 and FIG. 22B illustrates an example of an optimized illumination mode 2201, and is related to process situation 1207 of FIG. 12. The optimized pattern 2202 shows the patterning device pattern contours 2203 generated from the optimization process. As can be seen, the patterning device pattern contours do not necessarily conform to the guide contours presented earlier. Moreover, as discussed above, the patterning device pattern contours can span across connected polygons as shown at 2203 (e.g., the cross over adjacent sides and/or vertices of connected polygons). Further, the pattern 2202 here shows the addition of sub-resolution assist features 2204 to aid in the formation of the pattern. The assist features 2204 can be automatically generated by the software or manually applied by the user through the system subject to design rules.

Figure 23:
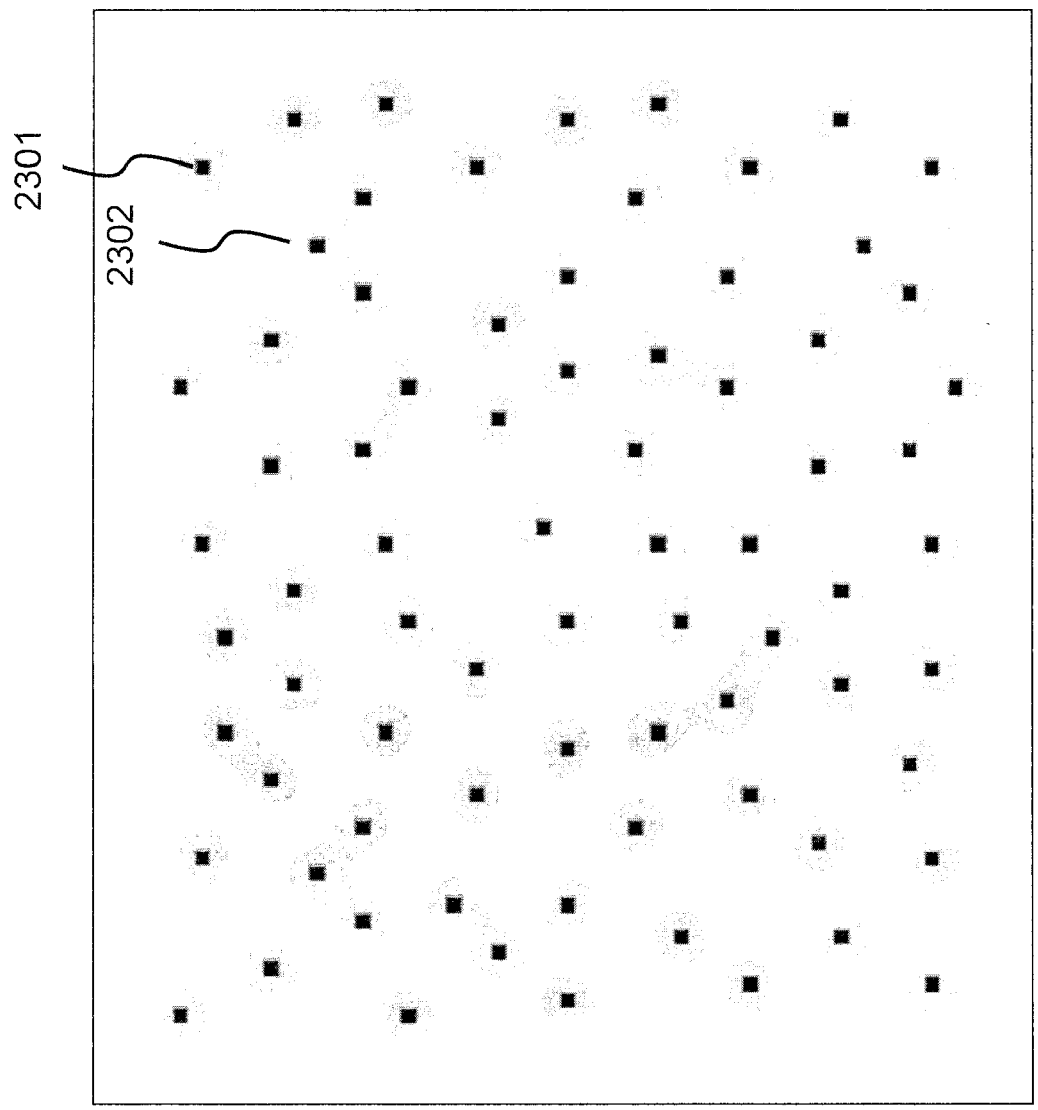
FIG. 23 illustrates an example of an after-development representation of the developed contour and is related to process situation 1208 of FIG. 12.

FIG. 23 illustrates a simulation of an after-development pattern contour corresponding to an exposure using an optimized patterning device pattern contour and is related to the process situation 1208 of FIG. 12. Referring to FIG. 23, the developed contour 2302 is shown to surround the initial design pattern polygons 2301.

Figure 24:
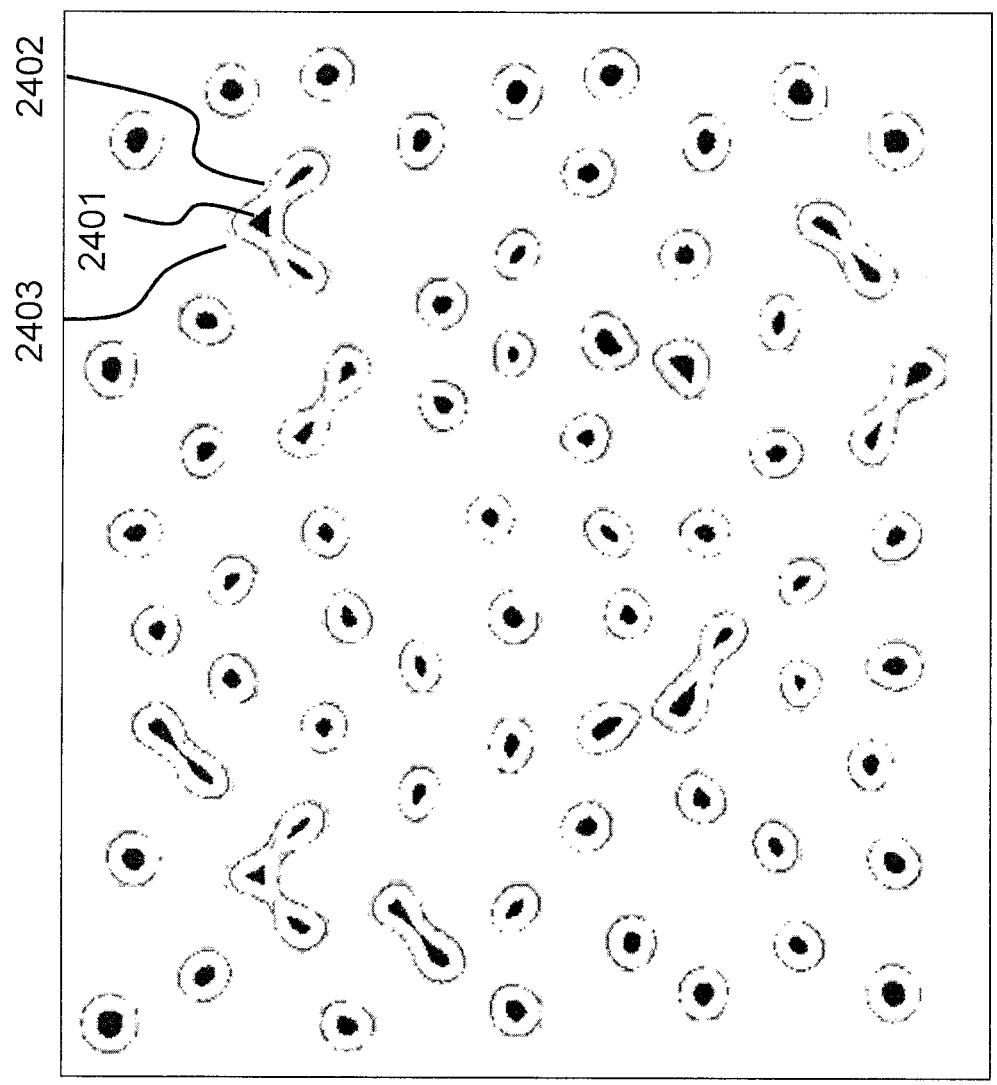
FIG. 24 illustrates an example of a representation of the pattern after shrinking and healing and is related to process situation 1209 of FIG. 12.

FIG. 24 illustrates a simulation of the after-development pattern contour subject to a shrinking and/or healing process as produced by a model of the shrinking and/or healing process (e.g., an etch and/or deposition model), and is related to the process situation 1209 of FIG. 12. The shrinking and/or healing process model can be user-selected or provided by the software. The shrinking and/or healing process model can be used to optimize one or more parameters of the shrinking and/or healing process in conjunction with optimization of the patterning device pattern contour.

Referring to FIGS. 23 and 24, an example of the shrinking and/or healing process is depicted. The recess created by an after-development pattern contour 2302 is completely or partially filled with a deposition material (the shrinking process) yielding an at least partly filled after-development pattern contour 2402 (shown in associated with the biased polygons 2403 for reference). The deposition material can be a block co-polymer that is subsequently self-assembled to cause phase separation of blocks, at least one of which etch resistant and another is not. The deposition can be a selective sidewall deposition method. The result is a shrink of the pattern contour. In an embodiment, the shrink can yield a final pattern feature recess 2401 close to or the same as the initial design pattern feature. Additionally, a heal process can be performed to expand or create an opening in the at least partly filled after-development pattern contour 2402. An etch can be used to expand a partly filled after-development pattern contour 2402 or an etch can be used to create the final pattern feature recess 2401 (e.g., by etching a block from a self-assembled block copolymer).

Figure 25:
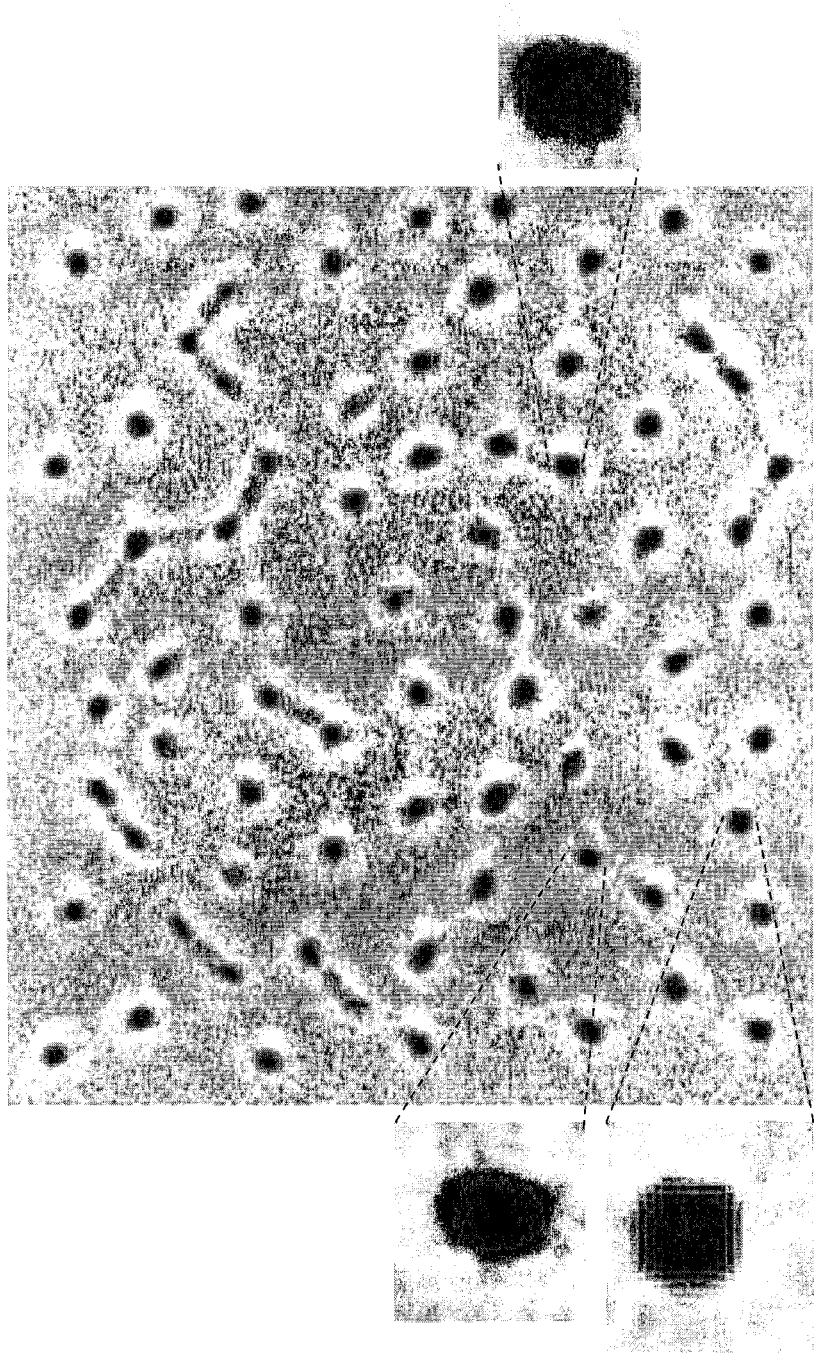
FIG. 25 illustrates an example of an after-etch inspection (AEI) sample image of pattern features corresponding to polygons of the initial design pattern.

FIG. 25 illustrates an after-etch inspection (AEI) sample image corresponding to process situation 1210 of FIG. 12. The image shows the polygons of the final pattern after etching with one or more appropriate (e.g., optimized) shrinking and/or healing parameters, and the enlarged features indicate that these final pattern features have a close to same size and/or shape of the initial design pattern. So, in an embodiment, the method can produce a final pattern highly accurate to the initial design pattern by using only one design pattern or fewer design patterns, reducing manufacturing cost, time, complexity, etc.

In an embodiment, the design intent of the pattern (e.g., design pattern 1001) can be varied to enable achievement of a desired contour (e.g., the after-development pattern contour 2402). That is, in an embodiment, the design pattern 1001 can be changed from an initial input form of the design pattern 1001.

Figure 26B:
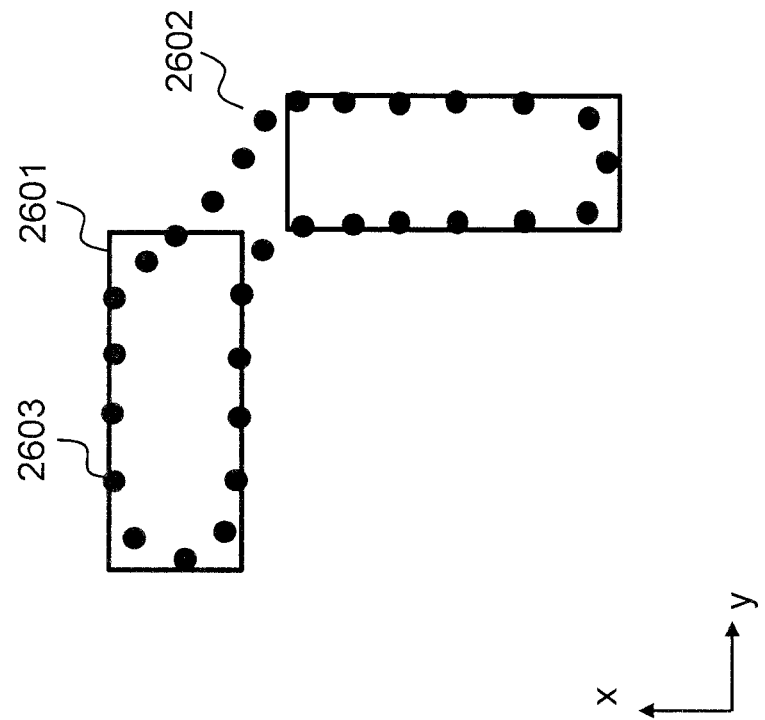
FIGS. 26A and 26B schematically illustrate an embodiment of changing a design intent to create a patterning device pattern.
Figure 26A:
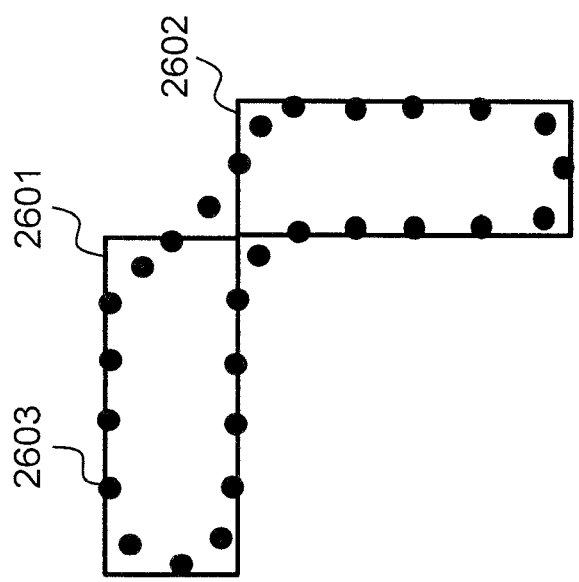

As an example of a change of design intent, the change can include a displacing of a design pattern feature such as moving one or more particular features PG within the plane of the design pattern 1201 (e.g., translating feature PG diagonally). An example of this type of change in design intent is presented by FIGS. 26A and 26B. In FIG. 26A, two polygons 2601 and 2602 are depicted (similar to as shown in FIG. 18) along with evaluation features 2603. In this case, the polygons 2601 and 2602 can be as in an initial input form of the design pattern or after biasing to enable connection of two or more polygons. Then, FIG. 26B shows an example of displacing of a design pattern feature, such as polygon 2602 in this case. That is, the polygon 2602 has been shifted in the X direction relative to its position as shown in FIG. 26A. The evaluation features 2603 can remain the same or additional evaluation feature 2603 can be added (as shown in FIG. 26B), wherein in either case the guided contour defined by the evaluation features 2603 can be effectively changed.

Figure 27B:
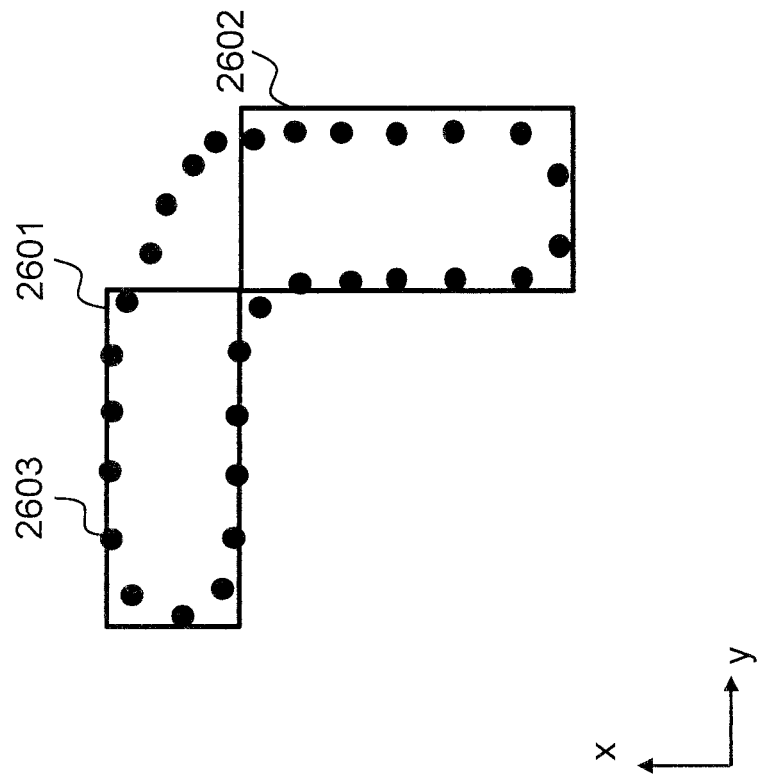
FIGS. 27A and 27B schematically illustrate a further embodiment of changing a design intent to create a patterning device pattern.
Figure 27A:
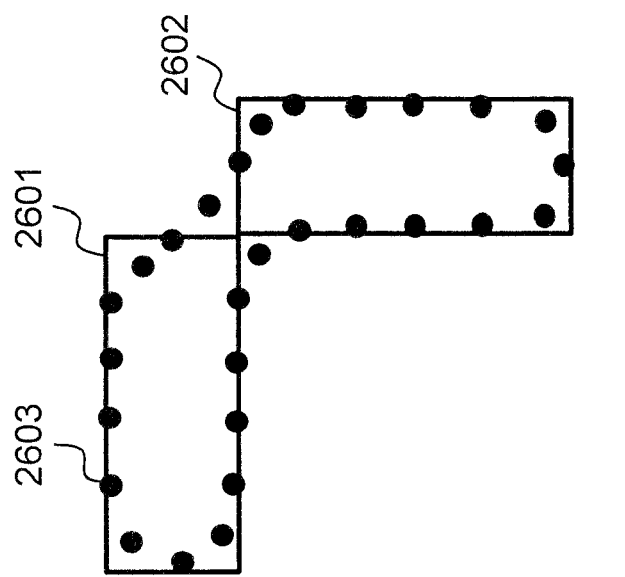

As another example, the change can include a bias of one or more design pattern features such as an enlarging or shrinking of one or more particular features PG in design pattern 1201. An example of this type of change in design intent is presented by FIGS. 27A and 27B. In FIG. 27A, two polygons 2701 and 2702 of design pattern 1201 are depicted (similar to as shown in FIG. 18) along with evaluation features 2703. In this case, the polygons 2701 and 2702 can be as in an initial input form of the design pattern or after biasing to enable connection of two or more polygons. Then, FIG. 27B shows an example of biasing of a design pattern feature, such as polygon 2702 in this case. That is, the polygon 2702 has been enlarged in the Y direction relative to its size as shown in FIG. 27A. The evaluation features 2703 can remain the same or additional evaluation feature 2703 can be added (as shown in FIG. 27B), wherein in either case the guided contour defined by the evaluation features 2703 can be effectively changed.

As another example, the change can include making a connection of two or more particular design pattern features, such as shifting a particular feature PG in design pattern 1201 to contact another particular feature PG in the design pattern 1201 and/or adding a bridge to connect two or more particular features PG in design pattern 1201. As another example, the change can include a splitting of a design pattern feature into two or more sub-features such as splitting one or more particular features PG in design pattern 1201.

In an embodiment, the extent to which the design pattern can be changed is governed by one or more process design rules. For example, a process design rule can specify the amount by which one or more pattern features may be shifted, biased, etc. within the scope of the overall design intent of the design pattern. For example, if a pattern feature of the design pattern is a contact hole then a process design rule can specify that the contact hole can be shifted, biased, etc. by an amount up to a certain threshold amount in one or more directions and yet still maintain in its functionality in the overall device. In an embodiment, the process design rule specifies a minimum width of pattern feature or a minimum spacing between pattern features.

Additionally or alternatively, in an embodiment, the extent to which the design pattern can be changed is governed by one or more patterning device manufacturing rules. For example, a patterning device manufacturing rule can specify the amount by which one or more pattern features may be shifted, biased, etc. yet still be able to produced using a patterning device (e.g., manufacturing of mask pattern). For example, if a pattern feature of the design pattern is a contact hole then a patterning device manufacturing rule can specify that the patterning device pattern feature corresponding to the contact hole can be shifted, biased, etc. by an amount up to a certain threshold amount in one or more directions and still be able to manufactured as part of a patterning device and/or be transferred as part of a pattern transfer process. As another example of a patterning device manufacturing rule, the rule can be specify a minimum permitted spacing between a patterning device feature and assist feature and so control the amount by which a patterning device pattern feature can be shifted, biased, etc. and yet still permit one or more assist features adjacent thereto.

So, in an embodiment of implementing the design intent, the design intent can be a design variable of an optimization process to produce a patterning device pattern based on the evaluation features or guided contour. For example, in an embodiment, the design intent can be a design variable of cost function of the optimization process.

In an embodiment, the optimization process comprises evaluation of one or more rules, such as one or more process design rules and/or one or more patterning device manufacturing rules. In an embodiment, the one or more rules can be a constraint on a design variable corresponding to the design intent. In an embodiment, the one or more rules can be a penalty as part of the cost function.

An example cost function that incorporates design intent as design variable and that employs a design or manufacturing rule as a penalty can be an edge placement error (EPE)-based cost function expressed as, e.g., in equation (8), wherein the cost function CF is in this case specified in terms of one or more variables of the intended design pattern ($v_{design}$) and optionally one or more selected from: one or more variables of the illumination mode ($v_{src}$), one or more variables of creating the patterning device pattern ($v_{mask}$), and/or one or more variables of the wavefront (e.g., the projection system) ($v_{wavefront}$). For example, SMO might include at least one or more variables of the illumination mode ($v_{src}$), and one or more variables of creating the patterning device pattern ($v_{mask}$). In an embodiment, a penalty $P_{RC}$ is used and corresponds to one or more design process rules and/or one or more patterning device manufacturing rules and optionally includes one or more penalties selected from: $P_{sidelobe}$ which is a penalty corresponding to undesired side edge printing of the pattern, $P_{slope}$ which is a penalty corresponding to the image slope (e.g., image log slope) of the pattern image, and/or $P_{src}$ which is a penalty corresponding to the design of the illumination mode. As will be appreciated, less (including none), more or different penalties can be applied.

In an embodiment, the optimization process having the design intent as a variable can use an output of a shrink and/or healing process model to help guide the optimization (and thus change the design intent). For example, the design intent can be used correct to failure that might occur in the shrink and/or healing process (or other related processes such as developing, etching, etc.).

So, in an embodiment, there is provided a new process for illumination mode and patterning device pattern optimization in combination with a process step (e.g., a shrink and/or healing process) to enable a pupil (e.g., an illumination mode) to be optimize to a desired contour for the process (e.g., a contour for the shrink and/or healing process). The optimized pupil with the optimized pattern can realize an after development contour with high fidelity which can be subsequently shrunk/healed to a design CD/pitch that is beyond the optical resolution of the exposure tool. The after development contour can be shrunk/healed in accordance with a shrinking/healing process model and the model can be used to specify shrinking/healing process parameters.

In an embodiment, a guide contour can be created, using, e.g., a text file with coordinates, that provides a custom guide contour spanning across polygons. Evaluation features can be applied with respect to the guide contour to enable a pattern optimization process. So, in an embodiment, the guide contour can be directly specified using connected polygons.

Further, in an embodiment, evaluation features can be provide with a tolerance band, e.g., an edge placement error (EPE) tolerance band that is perpendicular to the guide contour, to enable allowance for process variation.

Thus, the methods described can enable reduction in multiple patterning patterns to enable process cost reduction and/or to reduce MPT complexity (e.g., overlay complexity). The methods are applicable to both DUV and EUV. The methods can enable improved line edge roughness, critical dimension uniformity, and/or circle edge roughness (CER) for better control.

In an embodiment, there is provided a method for optimizing a patterning device pattern, the method comprising: obtaining an initial design pattern having a plurality of polygons; causing at least some of the polygons to be effectively connected with each other; placing evaluation features outside the boundaries of the polygons; and creating a patterning device pattern spanning across the connected polygons based on the evaluation features.

In an embodiment, the method further comprises generating a guide contour across at least some of the connected polygons and at least some of the evaluation features are located on the guide contour. In an embodiment, the method further comprises evaluating an intermediate patterning device pattern against the guide contour and adjusting a parameter of the creating the patterning device pattern based on the evaluation against the guide contour. In an embodiment, a patterning device pattern contour of the patterning device pattern is created based on a cost function including edge placement error and pattern placement error. In an embodiment, the method further comprises applying pattern placement gauges with respect to the polygons and the creating the patterning device pattern is based on values determined from the pattern placement gauges. In an embodiment, the evaluation features are bounded by a tolerance range used in creating the patterning device pattern. In an embodiment, the method further comprises biasing sizes of the polygons. In an embodiment, at least some of the biased polygons connect with each other. In an embodiment, the method further comprises forming a bridge to connect polygons. In an embodiment, the method further comprises selecting polygons closely adjacent to each other for connecting. In an embodiment, the closely adjacent polygons have a separation distance or pitch less than a k1 value of 0.28. In an embodiment, the creating the patterning device pattern comprises an optimization process to produce an optimized illumination mode and an optimized patterning device pattern. In an embodiment, creating the patterning device pattern further comprises changing a design intent of the initial design pattern such that the patterning device pattern implements a changed design intent of the initial design pattern. In an embodiment, changing the design intent comprises processing a cost function incorporating design intent as a design variable. In an embodiment, the changing the design intent comprises a processing a cost function with a design or manufacturing rule as a constraint or penalty thereof. In an embodiment, the changing the design intent comprises one or more selected from: shifting a position of one or more feature of the design pattern, biasing a size of one or more features of the design pattern, splitting one or more features of the design pattern into two or more parts, and/or connecting two or more features of the design pattern together. In an embodiment, creating the patterning device pattern comprises evaluating a shrink and/or healing process model.

In an embodiment, there is provided a method for optimizing a patterning device pattern, the method comprising: obtaining an initial design pattern having a plurality of polygons; causing at least some of the polygons to be effectively connected with each other; placing evaluation features with respect to the polygons; and generating a guide contour spanning across at least some of the connected polygons, wherein at least some of the evaluation features are located on the guide contour.

In an embodiment, the method further comprises evaluating an intermediate patterning device pattern against the guide contour and adjusting a parameter of creating the patterning device pattern based on the evaluation against the guide contour. In an embodiment, a patterning device pattern contour is created based on a cost function including edge placement error and pattern placement error. In an embodiment, the method further comprises applying pattern placement gauges with respect to the polygons and creating a patterning device pattern based on values determined from the pattern placement gauges. In an embodiment, the evaluation features are bounded by a tolerance range used in creating a patterning device pattern. In an embodiment, the causing the at least some of the polygons to be effectively connected comprises selecting polygons closely adjacent to each other for the connection and biasing them. In an embodiment, the closely adjacent polygons have a separation distance or pitch less than a k1 value of 0.28. In an embodiment, the method further comprises forming a bridge to connect polygons. In an embodiment, the method further comprises applying pattern placement gauges to connected polygons and creating a patterning device pattern based on values determined from the pattern placement gauges. In an embodiment, the evaluation features are bounded by a tolerance range used in creating a patterning device pattern. In an embodiment, the method further comprises creating a patterning device pattern based on the evaluation features. In an embodiment, the creating the patterning device pattern comprises an optimization process to produce an optimized illumination mode and an optimized patterning device pattern. In an embodiment, creating a patterning device pattern, wherein the creating comprises changing a design intent of the initial design pattern such that the patterning device pattern implements a changed design intent of the initial design pattern. In an embodiment, changing the design intent comprises processing a cost function incorporating design intent as a design variable. In an embodiment, the changing the design intent comprises a processing a cost function with a design or manufacturing rule as a constraint or penalty thereof. In an embodiment, the changing the design intent comprises one or more selected from: shifting a position of one or more feature of the design pattern, biasing a size of one or more features of the design pattern, splitting one or more features of the design pattern into two or more parts, and/or connecting two or more features of the design pattern together. In an embodiment, the method further comprises creating a patterning device pattern based on an output of a shrink and/or healing process model.

In an embodiment, there is provided a method for optimizing a patterning device pattern, the method comprising: obtaining an initial design pattern having a plurality of polygons; causing at least some of the polygons to be effectively connected with each other; placing evaluation features with respect to the connected polygons; and creating a patterning device pattern contour across a connection or intersection point of the connected polygons based on the evaluation features.

In an embodiment, the method further comprises generating a guide contour across at least some of the connected polygons and at least some of the evaluation features are located on the guide contour. In an embodiment, the method further comprises evaluating an intermediate patterning device pattern against the guide contour and adjusting a parameter of the creating the patterning device pattern based on the evaluation against the guide contour. In an embodiment, a patterning device pattern contour of the patterning device pattern is created based on a cost function including edge placement error and pattern placement error. In an embodiment, the method further comprises applying pattern placement gauges with respect to the polygons and the creating the patterning device pattern is based on values determined from the pattern placement gauges. In an embodiment, the evaluation features are bounded by a tolerance range used in creating the patterning device pattern. In an embodiment, the method further comprises forming a bridge to connect the polygons. In an embodiment, the causing the at least some of the polygons to be effectively connected comprises selecting polygons closely adjacent to each other for the connection and biasing those polygons. In an embodiment, the closely adjacent polygons have a separation distance or pitch less than a k1 value of 0.28. In an embodiment, creating the patterning device pattern further comprises changing a design intent of the initial design pattern such that the patterning device pattern implements a changed design intent of the initial design pattern. In an embodiment, changing the design intent comprises processing a cost function incorporating design intent as a design variable. In an embodiment, the changing the design intent comprises a processing a cost function with a design or manufacturing rule as a constraint or penalty thereof. In an embodiment, the changing the design intent comprises one or more selected from: shifting a position of one or more feature of the design pattern, biasing a size of one or more features of the design pattern, splitting one or more features of the design pattern into two or more parts, and/or connecting two or more features of the design pattern together. In an embodiment, creating the patterning device pattern comprises evaluating a shrink and/or healing process model.

In an embodiment, there is provided a computer program product comprising a computer non-transitory readable medium having instructions recorded thereon, the instructions when executed by a computer implementing a method as described herein.

As will be appreciated by one of ordinary skill in the art, the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present application has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

Figure 28:
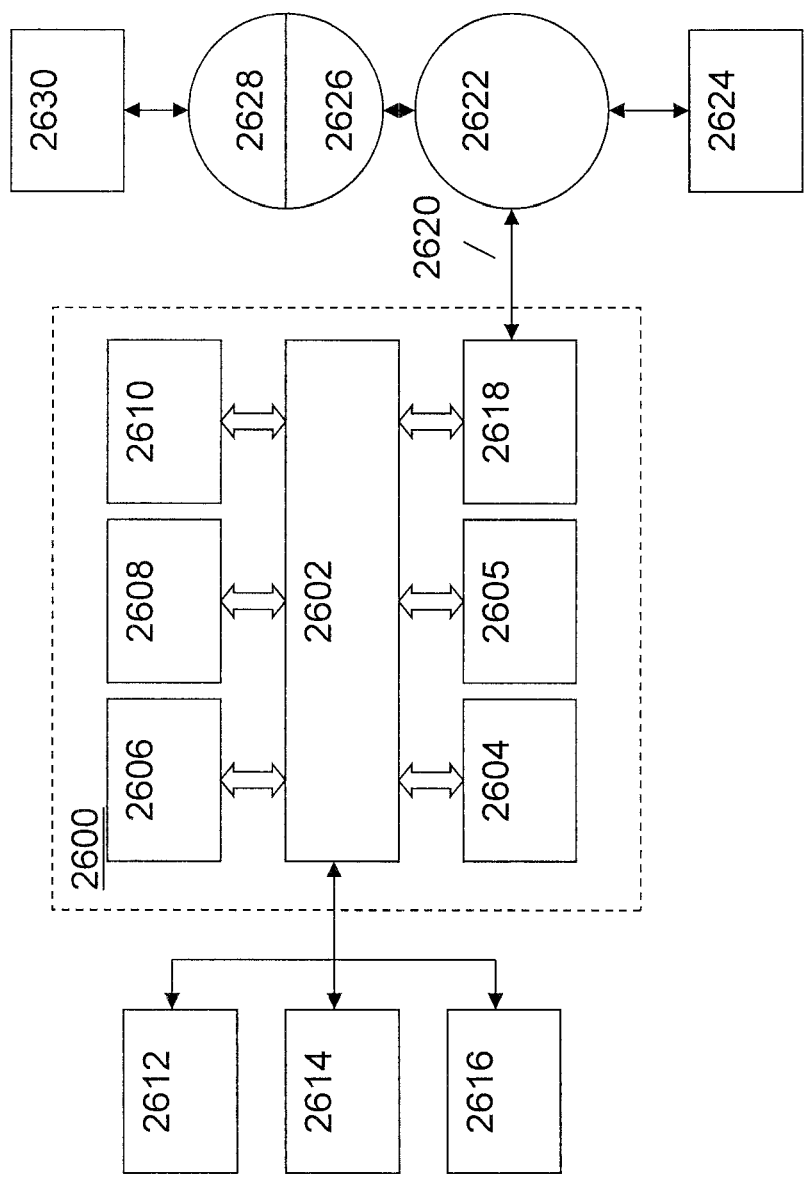
FIG. 28 illustrates a block diagram of an example of a computer system.

FIG. 28 is a block diagram that illustrates an embodiment of a computer system 2600 which can assist in implementing any of the methods and flows disclosed herein. Computer system 2600 includes a bus 2602 or other communication mechanism for communicating information, and a processor 2604 (or multiple processors 2604 and 2605) coupled with bus 2602 for processing information. Computer system 2600 also includes a main memory 2606, such as a random access memory (RAM) or other dynamic storage device, coupled to bus 2602 for storing information and instructions to be executed by processor 2604. Main memory 2606 also may be used for storing temporary variables or other intermediate information during execution of instructions to be executed by processor 2604. Computer system 2600 further includes a read only memory (ROM) 2608 or other static storage device coupled to bus 2602 for storing static information and instructions for processor 2604. A storage device 2610, such as a magnetic disk or optical disk, is provided and coupled to bus 2602 for storing information and instructions.

Computer system 2600 may be coupled via bus 2602 to a display 2612, such as a cathode ray tube (CRT) or flat panel or touch panel display for displaying information to a computer user. An input device 2614, including alphanumeric and other keys, is coupled to bus 2602 for communicating information and command selections to processor 2604. Another type of user input device is cursor control 2616, such as a mouse, a trackball, or cursor direction keys for communicating direction information and command selections to processor 2604 and for controlling cursor movement on display 2612. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 2600 in response to processor 2604 executing one or more sequences of one or more instructions contained in main memory 2606. Such instructions may be read into main memory 2606 from another computer-readable medium, such as storage device 2610. Execution of the sequences of instructions contained in main memory 2606 causes processor 2604 to perform the process steps described herein. One or more processors in a multi-processing arrangement may also be employed to execute the sequences of instructions contained in main memory 2606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 2604 for execution. Such a medium may take many forms, including but not limited to, non-volatile media, volatile media, and transmission media. Non-volatile media include, for example, optical or magnetic disks, such as storage device 2610. Volatile media include dynamic memory, such as main memory 2606. Transmission media include coaxial cables, copper wire and fiber optics, including the wires that comprise bus 2602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 2604 for execution. For example, the instructions may initially be borne on a magnetic disk of a remote computer. The remote computer can load the instructions into its dynamic memory and send the instructions over a telephone line using a modem. A modem local to computer system 2600 can receive the data on the telephone line and use an infrared transmitter to convert the data to an infrared signal. An infrared detector coupled to bus 2602 can receive the data carried in the infrared signal and place the data on bus 2602. Bus 2602 carries the data to main memory 2606, from which processor 2604 retrieves and executes the instructions. The instructions received by main memory 2606 may optionally be stored on storage device 2610 either before or after execution by processor 2604.

Computer system 2600 may also include a communication interface 2618 coupled to bus 2602. Communication interface 2618 provides a two-way data communication coupling to a network link 2620 that is connected to a local network 2622. For example, communication interface 2618 may be an integrated services digital network (ISDN) card or a modem to provide a data communication connection to a corresponding type of telephone line. As another example, communication interface 2618 may be a local area network (LAN) card to provide a data communication connection to a compatible LAN. Wireless links may also be implemented. In any such implementation, communication interface 2618 sends and receives electrical, electromagnetic or optical signals that carry digital data streams representing various types of information.

Network link 2620 typically provides data communication through one or more networks to other data devices. For example, network link 2620 may provide a connection through local network 2622 to a host computer 2624 or to data equipment operated by an Internet Service Provider (ISP) 2626. ISP 2626 in turn provides data communication services through the worldwide packet data communication network, now commonly referred to as the "Internet" 2628. Local network 2622 and Internet 2628 both use electrical, electromagnetic or optical signals that carry digital data streams. The signals through the various networks and the signals on network link 2620 and through communication interface 2618, which carry the digital data to and from computer system 2600, are exemplary forms of carrier waves transporting the information.

Computer system 2600 can send messages and receive data, including program code, through the network(s), network link 2620, and communication interface 2618. In the Internet example, a server 2630 might transmit a requested code for an application program through Internet 2628, ISP 2626, local network 2622 and communication interface 2618. One such downloaded application may provide for a method or portion thereof as described herein, for example. The received code may be executed by processor 2604 as it is received, and/or stored in storage device 2610, or other non-volatile storage for later execution. In this manner, computer system 2600 may obtain application code in the form of a carrier wave.

Figure 29:
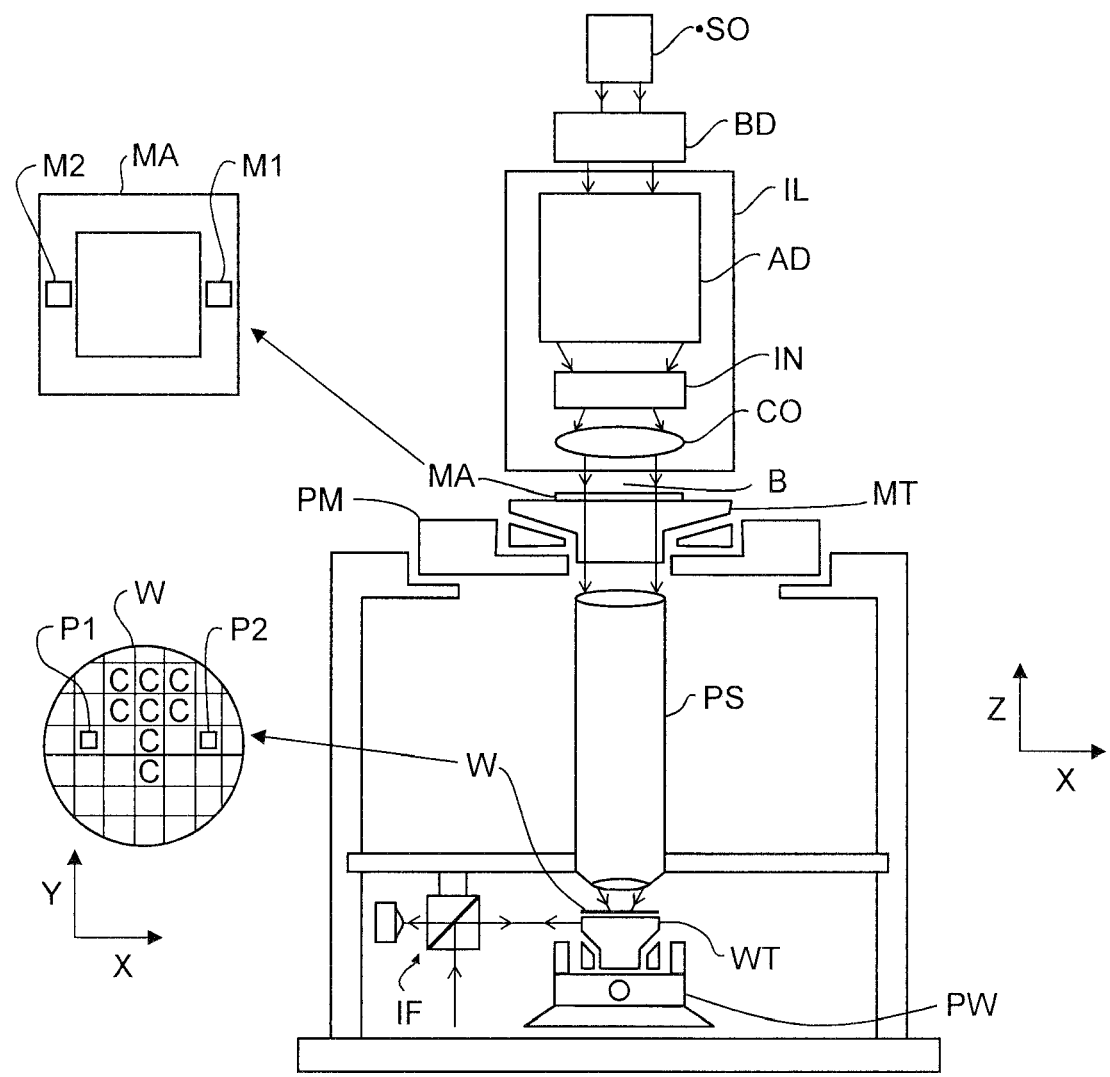
FIG. 29 illustrates a schematic diagram of a lithography apparatus.

FIG. 29 schematically depicts an exemplary lithography apparatus in association with which the techniques described herein can be utilized. The apparatus comprises: an illumination system IL, to condition a beam B of radiation. In this particular case, the illumination system also comprises a radiation source SO; a first object table (e.g., patterning device table) MT provided with a patterning device holder to hold a patterning device MA (e.g., a reticle), and connected to a first positioner to accurately position the patterning device with respect to item PS; a second object table (substrate table) WT provided with a substrate holder to hold a substrate W (e.g., a resist-coated silicon wafer), and connected to a second positioner to accurately position the substrate with respect to item PS; a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array, CCD matrix or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 29 that the source SO may be within the housing of the lithography apparatus (as is often the case when the source SO is a mercury lamp, for example), but that it may also be remote from the lithography apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the projection system PL, which focuses the beam B onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 29. However, in the case of a stepper (as opposed to a step-and-scan tool) the patterning device table MT may just be connected to a short stroke actuator, or may be fixed.

The depicted tool can be used in two different modes: In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam B.

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the projection system PL (typically, M=¼ or ⅕ or in some case the magnification can be anamorphic (e.g., M in the scanning direction is about ⅛ while M in an orthogonal direction is about ¼). In this manner, a relatively large target portion C can be exposed, without having to compromise on resolution.

Further, the lithography apparatus may be of a type having two or more tables (e.g., two or more substrate table, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithography apparatuses are described, for example, in U.S. Pat. No. 5,969,441, incorporated herein by reference in its entirety.

Figure 30:
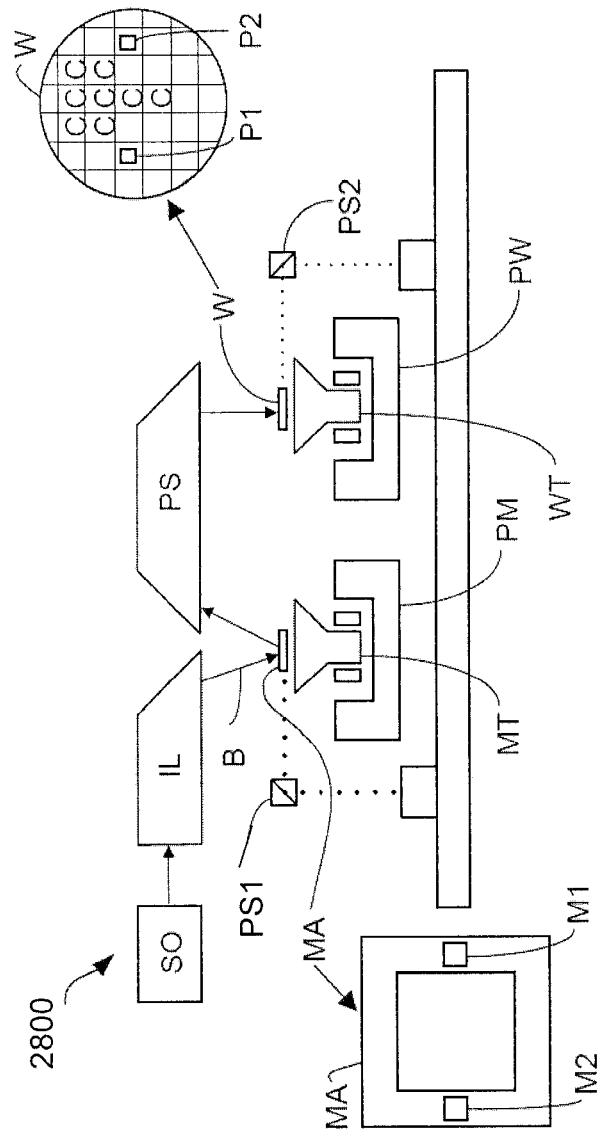
FIG. 30 illustrates a schematic diagram of another lithography apparatus.

FIG. 30 schematically depicts another exemplary lithography apparatus 2800 in association with which the techniques described herein can be utilized. The lithography apparatus 2800 comprises: a source collector module SO; an illumination system (illuminator) IL configured to condition a radiation beam B (e.g. EUV radiation); a support structure (e.g. a patterning device table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 2800 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 30, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 2800 could be used in at least one of the following modes:

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 31:
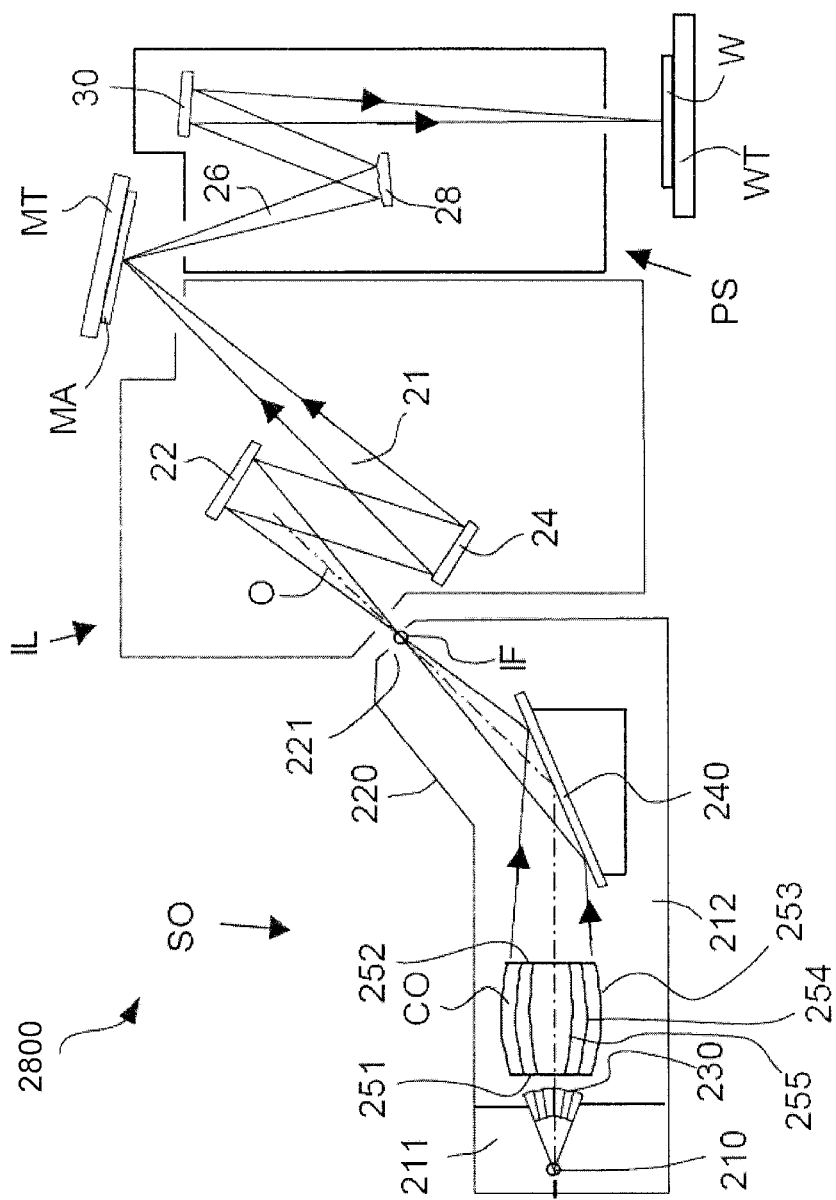
FIG. 31 illustrates a more detailed view of the apparatus in FIG. 30.

FIG. 31 shows the apparatus 2800 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 31.

Collector optic CO, as illustrated in FIG. 31, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 32:
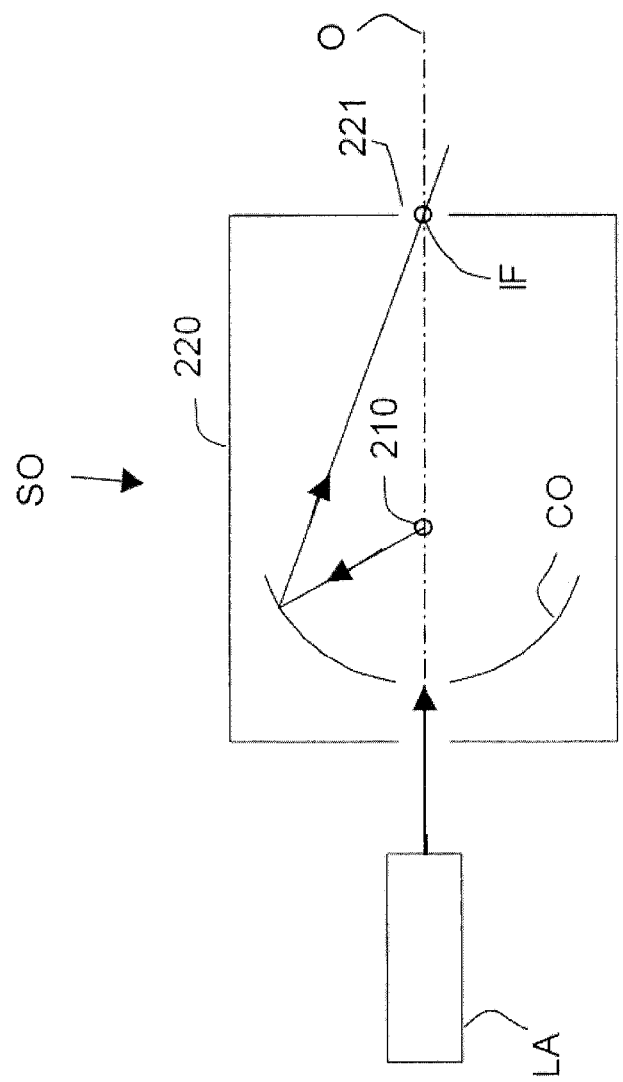
FIG. 32 illustrates a more detailed view of the source collector module of the apparatus of FIGS. 30 and 31 of the present application.

Alternatively, the source collector module SO may be part of an LPP radiation system as shown in FIG. 32. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220. The embodiments may further be described using the following clauses:

1. A method for optimizing a patterning device pattern, the method comprising:

obtaining an initial design pattern having a plurality of polygons;

causing at least some of the polygons to be effectively connected with each other;

placing evaluation features outside the boundaries of the polygons; and creating a patterning device pattern spanning across the connected polygons based on the evaluation features.

2. The method of clause 1, further comprising generating a guide contour across at least some of the connected polygons and at least some of the evaluation features are located on the guide contour.

3. The method of clause 2, further comprising evaluating an intermediate patterning device pattern against the guide contour and adjusting a parameter of the creating the patterning device pattern based on the evaluation against the guide contour.

4. The method of any of clauses 1-3, wherein a patterning device pattern contour of the patterning device pattern is created based on a cost function including edge placement error and pattern placement error.

5. The method of any of clauses 1-4, further comprising applying pattern placement gauges with respect to the polygons and the creating the patterning device pattern is based on values determined from the pattern placement gauges.

6. The method of any of clauses 1-5, wherein the evaluation features are bounded by a tolerance range used in creating the patterning device pattern.

7. The method of any of clauses 1-6, further comprising biasing sizes of the polygons.

8. The method of clause 7, wherein at least some of the biased polygons connect with each other.

9. The method of any of clauses 1-8, further comprising forming a bridge to connect polygons.

10. The method of any of clauses 1-9, further comprising selecting polygons closely adjacent to each other for connecting.

11. The method of clause 10, wherein the closely adjacent polygons have a separation distance or pitch less than a k1 value of 0.28.

12. The method of any of clauses 1-11, wherein the creating the patterning device pattern comprises an optimization process to produce an optimized illumination mode and an optimized patterning device pattern.

13. The method of any of clauses 1-12, wherein creating the patterning device pattern further comprises changing a design intent of the initial design pattern such that the patterning device pattern implements a changed design intent of the initial design pattern.

14. The method of clause 13, wherein changing the design intent comprises processing a cost function incorporating design intent as a design variable.

15. The method of clause 13 or clause 14, wherein the changing the design intent comprises a processing a cost function with a design or manufacturing rule as a constraint or penalty thereof.

16. The method of any of clauses 13-15, wherein the changing the design intent comprises one or more selected from: shifting a position of one or more feature of the design pattern, biasing a size of one or more features of the design pattern, splitting one or more features of the design pattern into two or more parts, and/or connecting two or more features of the design pattern together.

17. The method of any of clauses 1-16, wherein creating the patterning device pattern comprises evaluating a shrink and/or healing process model.

18. A method for optimizing a patterning device pattern, the method comprising:

obtaining an initial design pattern having a plurality of polygons;

causing at least some of the polygons to be effectively connected with each other;

placing evaluation features with respect to the polygons; and generating a guide contour spanning across at least some of the connected polygons, wherein at least some of the evaluation features are located on the guide contour.

19. The method of clause 18, further comprising evaluating an intermediate patterning device pattern against the guide contour and adjusting a parameter of creating the patterning device pattern based on the evaluation against the guide contour.

20. The method of clause 18 or clause 19, wherein a patterning device pattern contour is created based on a cost function including edge placement error and pattern placement error.

21. The method of any of clauses 18-20, further comprising applying pattern placement gauges with respect to the polygons and creating a patterning device pattern based on values determined from the pattern placement gauges.

22. The method of any of clauses 18-21, wherein the evaluation features are bounded by a tolerance range used in creating a patterning device pattern.

23. The method of any of clauses 18-22, wherein the causing the at least some of the polygons to be effectively connected comprises selecting polygons closely adjacent to each other for the connection and biasing them.

24. The method of clause 23, wherein the closely adjacent polygons have a separation distance or pitch less than a k1 value of 0.28.

25. The method of any of clauses 18-24, further comprising forming a bridge to connect polygons.

26. The method of any of clauses 18-25, further comprising applying pattern placement gauges to connected polygons and creating a patterning device pattern based on values determined from the pattern placement gauges.

27. The method of any of clauses 18-26, wherein the evaluation features are bounded by a tolerance range used in creating a patterning device pattern.

28. The method of any of clauses 18-27, further comprising creating a patterning device pattern based on the evaluation features.

29. The method of clause 28, wherein the creating the patterning device pattern comprises an optimization process to produce an optimized illumination mode and an optimized patterning device pattern.

30. The method of any of clauses 18-29, further comprising creating a patterning device pattern, wherein the creating comprises changing a design intent of the initial design pattern such that the patterning device pattern implements a changed design intent of the initial design pattern.

31. The method of clause 30, wherein changing the design intent comprises processing a cost function incorporating design intent as a design variable.

32. The method of clause 30 or clause 31, wherein the changing the design intent comprises a processing a cost function with a design or manufacturing rule as a constraint or penalty thereof.

33. The method of any of clauses 30-32, wherein the changing the design intent comprises one or more selected from: shifting a position of one or more feature of the design pattern, biasing a size of one or more features of the design pattern, splitting one or more features of the design pattern into two or more parts, and/or connecting two or more features of the design pattern together.

34. The method of any of clauses 18-33, further comprising creating a patterning device pattern based on an output of a shrink and/or healing process model.

35. A method for optimizing a patterning device pattern, the method comprising:
obtaining an initial design pattern having a plurality of polygons;
causing at least some of the polygons to be effectively connected with each other;
placing evaluation features with respect to the connected polygons; and
creating a patterning device pattern contour across a connection or intersection point of the connected polygons based on the evaluation features.

36. The method of clause 35, further comprising generating a guide contour across at least some of the connected polygons and at least some of the evaluation features are located on the guide contour.

37. The method of clause 36, further comprising evaluating an intermediate patterning device pattern against the guide contour and adjusting a parameter of the creating the patterning device pattern based on the evaluation against the guide contour.

38. The method of any of clauses 35-37, wherein a patterning device pattern contour of the patterning device pattern is created based on a cost function including edge placement error and pattern placement error.

39. The method of any of clauses 35-38, further comprising applying pattern placement gauges with respect to the polygons and the creating the patterning device pattern is based on values determined from the pattern placement gauges.

40. The method of any of clauses 35-39, wherein the evaluation features are bounded by a tolerance range used in creating the patterning device pattern.

41. The method of any of clauses 35-40, further comprising forming a bridge to connect the polygons.

42. The method of any of clauses 35-41, wherein the causing the at least some of the polygons to be effectively connected comprises selecting polygons closely adjacent to each other for the connection and biasing those polygons.

43. The method of clause 42, wherein the closely adjacent polygons have a separation distance or pitch less than a k1 value of 0.28.

44. The method of any of clauses 35-43, wherein creating the patterning device pattern further comprises changing a design intent of the initial design pattern such that the patterning device pattern implements a changed design intent of the initial design pattern.

45. The method of clause 44, wherein changing the design intent comprises processing a cost function incorporating design intent as a design variable.

46. The method of clause 44 or clause 45, wherein the changing the design intent comprises a processing a cost function with a design or manufacturing rule as a constraint or penalty thereof.

47. The method of any of clauses 44-46, wherein the changing the design intent comprises one or more selected from: shifting a position of one or more feature of the design pattern, biasing a size of one or more features of the design pattern, splitting one or more features of the design pattern into two or more parts, and/or connecting two or more features of the design pattern together.

48. The method of any of clauses 35-47, wherein creating the patterning device pattern comprises evaluating a shrink and/or healing process model.

49. A computer program product comprising a computer non-transitory readable medium having instructions recorded thereon, the instructions when executed by a computer implementing the method of any of clauses 1-48.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:
1. A method for optimizing a patterning device pattern, the method comprising:
obtaining an initial design pattern having a plurality of polygons;
shifting and/or biasing, by a hardware computer system, at least some of the polygons in the initial design pattern to be effectively connected with each other;

placing, by the hardware computer system, evaluation features outside the boundaries of the shifted and/or biased polygons; and creating, by the hardware computer system, a patterning device pattern spanning across the shifted and/or biased polygons based on the evaluation features.

2. The method of claim 1, further comprising generating a guide contour across at least some of the shifted and/or biased polygons and at least some of the evaluation features are located on the guide contour.

3. The method of claim 2, further comprising evaluating an intermediate patterning device pattern against the guide contour and adjusting a parameter of the creating the patterning device pattern based on the evaluation against the guide contour.

4. The method of claim 1, wherein a patterning device pattern contour of the patterning device pattern is created based on a cost function including edge placement error and pattern placement error.

5. The method of claim 1, further comprising applying pattern placement gauges with respect to the polygons and the creating the patterning device pattern is based on values determined from the pattern placement gauges.

6. The method of claim 1, wherein the evaluation features are bounded by a tolerance range used in creating the patterning device pattern.

7. The method of claim 1, comprising biasing sizes of the polygons.

8. The method of claim 1, further comprising:
forming a bridge to connect polygons; and/or
selecting polygons closely adjacent to each other for connecting.

9. The method of claim 1, wherein the creating the patterning device pattern comprises an optimization process to produce an optimized illumination mode and an optimized patterning device pattern.

10. The method of claim 1, wherein creating the patterning device pattern further comprises changing a design intent of the initial design pattern such that the patterning device pattern implements a changed design intent of the initial design pattern.

11. The method of claim 10, wherein:
changing the design intent comprises processing a cost function incorporating design intent as a design variable, and/or
changing the design intent comprises processing a cost function with a design or manufacturing rule as a constraint or penalty thereof, and/or
changing the design intent comprises one or more selected from: shifting a position of one or more features of the design pattern, biasing a size of one or more features of the design pattern, splitting one or more features of the design pattern into two or more parts, and/or connecting two or more features of the design pattern together.

12. The method of claim 1, wherein creating the patterning device pattern comprises evaluating a shrink and/or healing process model.

13. A method for optimizing a patterning device pattern, the method comprising:
obtaining an initial design pattern having a plurality of polygons;
shifting and/or biasing, by a hardware computer system, at least some of the polygons in the initial design pattern to be effectively connected with each other;
placing, by the hardware computer system, evaluation features with respect to the shifted and/or biased polygons; and generating, by the hardware computer system, a guide contour spanning across at least some of the shifted and/or biased polygons, wherein at least some of the evaluation features are located on the guide contour.

14. A method for optimizing a patterning device pattern, the method comprising:
obtaining an initial design pattern having a plurality of polygons;
shifting and/or biasing, by a hardware computer system, at least some of the polygons in the initial design pattern to be effectively connected with each other;
placing, by a hardware computer system, evaluation features with respect to the shifted and/or biased polygons; and
creating, by a hardware computer system, a patterning device pattern contour across a connection or intersection point of the shifted and/or biased polygons based on the evaluation features.

15. A computer program product comprising a non-transitory computer-readable medium having instructions therein, the instructions, when executed by a computer system, configured to cause the computer system to at least:
obtain an initial design pattern for creating a patterning device pattern, the initial design pattern having a plurality of polygons;
shift and/or bias at least some of the polygons in the initial design pattern to be effectively connected with each other;
place evaluation features outside the boundaries of the shifted and/or biased polygons; and
create a patterning device pattern spanning across the shifted and/or biased polygons based on the evaluation features.

16. The method of claim 13, wherein a patterning device pattern contour is created based on a cost function including edge placement error and pattern placement error.

17. The method of claim 13, further comprising applying pattern placement gauges with respect to the polygons and creating a patterning device pattern based on values determined from the pattern placement gauges.

18. A computer program product comprising a non-transitory computer-readable medium having instructions therein, the instructions, when executed by a computer system, configured to cause the computer system to at least:
obtain an initial design pattern for creating a patterning device pattern, the initial design pattern having a plurality of polygons;
shift and/or bias at least some of the polygons in the initial design pattern to be effectively connected with each other;
place evaluation features with respect to the shifted and/or biased polygons; and
generate a guide contour spanning across at least some of the shifted and/or biased polygons, wherein at least some of the evaluation features are located on the guide contour.

19. The method of claim 14, further comprising generating a guide contour across at least some of the shifted and/or biased polygons and at least some of the evaluation features are located on the guide contour.

20. A computer program product comprising a non-transitory computer-readable medium having instructions therein, the instructions, when executed by a computer system, configured to cause the computer system to at least:
obtain an initial design pattern having a plurality of polygons;

shift and/or bias at least some of the polygons in the initial design pattern to be effectively connected with each other;
place evaluation features with respect to the shifted and/or biased polygons; and
create a patterning device pattern contour across a connection or intersection point of the shifted and/or biased polygons based on the evaluation features.

* * * * *